United States Patent
Fukunaga et al.

(10) Patent No.: US 6,560,261 B2
(45) Date of Patent: May 6, 2003

(54) SEMICONDUCTOR LASER DEVICE HAVING INGAAS COMPRESSIVE-STRAIN ACTIVE LAYER, GAASP TENSILE-STRAIN BARRIER LAYERS, AND INGAP OPTICAL WAVEGUIDE LAYERS

(75) Inventors: Toshiaki Fukunaga, Kaisei-machi (JP); Tsuyoshi Ohgoh, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/012,042

(22) Filed: Dec. 11, 2001

(65) Prior Publication Data

US 2002/0122447 A1 Sep. 5, 2002

(30) Foreign Application Priority Data

Dec. 12, 2000 (JP) ............................ 2000-376815
Apr. 10, 2001 (JP) ............................ 2001-110909
Aug. 20, 2001 (JP) ............................ 2001-249111

(51) Int. Cl.$^7$ ................................................ H01S 5/00
(52) U.S. Cl. .............................. 372/46; 372/43; 372/45
(58) Field of Search ........................... 372/43, 45, 46

(56) References Cited

U.S. PATENT DOCUMENTS

| | | | | |
|---|---|---|---|---|
| 5,136,602 A | * | 8/1992 | Sugawara | 372/45 |
| 5,521,935 A | * | 5/1996 | Irikawa | 372/45 |
| 5,559,818 A | * | 9/1996 | Shono et al. | 372/45 |
| 6,028,874 A | * | 2/2000 | Wada et al. | 370/252 |
| 6,396,863 B1 | * | 5/2002 | Fukunaga | 372/46 |
| 6,449,299 B1 | * | 9/2002 | Sato | 372/45 |
| 2002/0015428 A1 | * | 2/2002 | Fukunaga | 372/46 |

OTHER PUBLICATIONS

IEEE Journal of Selected Topics in Quantum Electronics, vol. 1, No. 2, Jun. 1995, pp. 189.

* cited by examiner

Primary Examiner—Paul Ip
Assistant Examiner—Phillip Nguyen
(74) Attorney, Agent, or Firm—Sughrue Mion, PLLC

(57) ABSTRACT

In a semiconductor-laser device: a compressive-strain quantum-well active layer is made of $In_{x3}Ga_{1-x3}As_{1-y3}P_{y3}$ ($0<x3\leq0.4$ and $0\leq y3\leq0.1$); tensile-strain barrier layers made of $In_{x2}Ga_{1-x2}As_{1-y2}P_{1-y2}$ ($0\leq x2<0.49y2$ and $0<y2\leq0.4$) are formed above and under the compressive-strain quantum-well active layer; and optical waveguide layers being made of either p-type or i-type $In_{0.49}Ga_{0.51}P$ are formed above the upper tensile-strain barrier layer and under the lower tensile-strain barrier layer. Preferably, the absolute value of a sum of a first product and a second product is less than or equal to 0.25 nm, where the first product is a product of a strain and a thickness of said compressive-strain active layer, and the second product is a product of a strain of said lower and upper tensile-strain barrier layers and a total thickness of the lower and upper tensile-strain barrier layers.

22 Claims, 11 Drawing Sheets

F I G.9
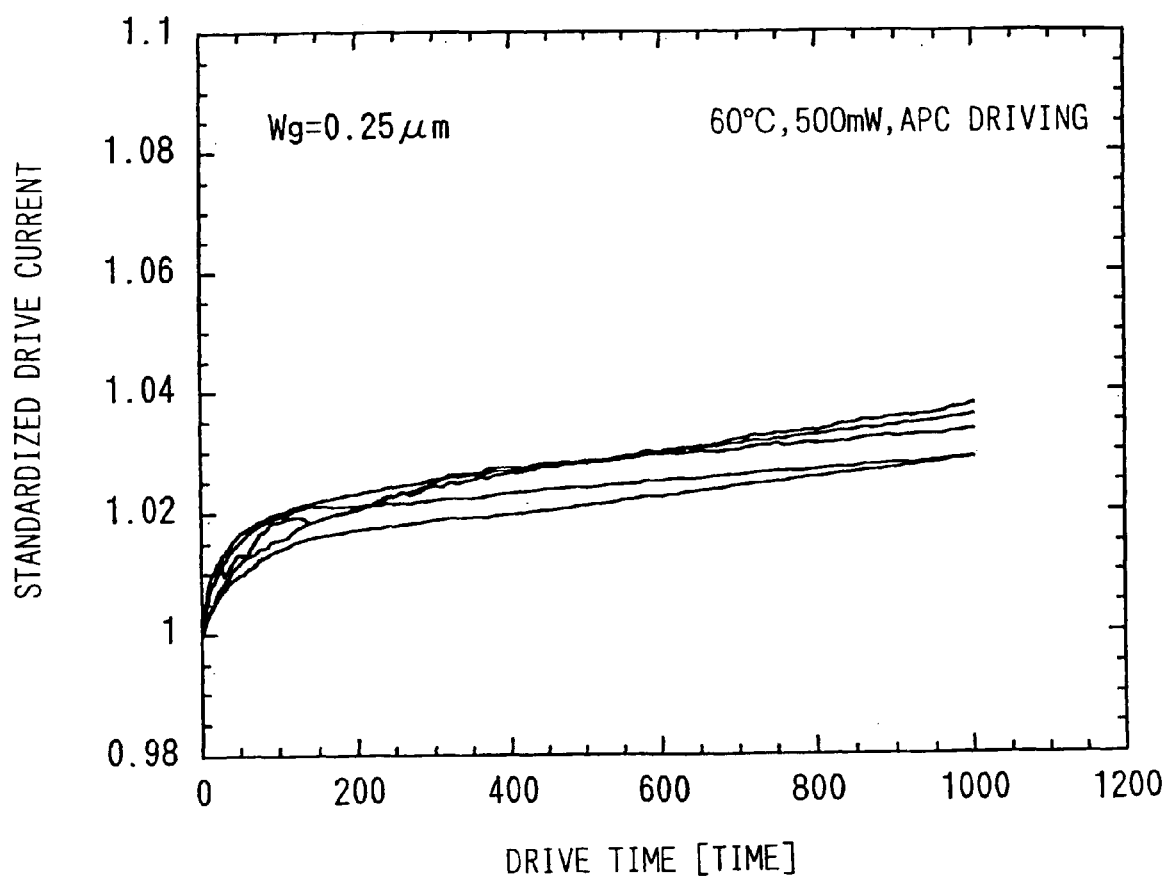

SEMICONDUCTOR LASER DEVICE HAVING INGAAS COMPRESSIVE-STRAIN ACTIVE LAYER, GAASP TENSILE-STRAIN BARRIER LAYERS, AND INGAP OPTICAL WAVEGUIDE LAYERS

BACKGROUND OF THE INVENTION

1. Field of the Invention

The present invention relates to a semiconductor laser device having a compressive-strain active layer.

2. Description of the Related Art

M. Sagawa et al. ("High-power highly-reliable operation of 0.98-micrometer InGaAs-InGaP strain-compensated single-quantum-well lasers with tensile-strained InGaAsP barriers," IEEE Journal of Selected Topics in Quantum Electronics, Vol. 1, No. 2, 1995, pp.189) disclose semiconductor laser device which emits laser light in the 0.98-micrometer band without employing Al in any of its constituent layers. This semiconductor laser device is formed as follows.

An n-type InGaP cladding layer, an undoped InGaAsP optical waveguide layer, an InGaAsP tensile-strain barrier layer, an InGaAs double-quantum-well active layer, an InGaAsP tensile-strain barrier layer, an undoped InGaAsP optical waveguide layer, a p-type InGaP first upper cladding layer, a p-type GaAs optical waveguide layer, a p-type InGaP second upper cladding layer, a p-type GaAs cap layer, and an insulation film are formed on an n-type GaAs substrate in this order. Next, a narrow-stripe ridge structure is formed above the p-type InGaP first upper cladding layer by conventional photolithography and selective etching, and an n-type $In_{0.5}Ga_{0.5}P$ material is embedded in both sides of the ridge structure by selective MOCVD. Finally, the insulation film is removed, and a p-type GaAs contact layer is formed. Thus, an index-guided semiconductor laser device having a current confinement structure is realized.

The above semiconductor laser device oscillates in a fundamental transverse mode. It is reported that the reliability of the above semiconductor laser device is improved since the strain in the active layer can be compensated for. However, in the above semiconductor laser device, the characteristic temperature, which is obtained from the temperature dependence of the threshold current, is as low as 156K. Therefore, in practice, temperature control is necessary, and thus cost reduction is difficult.

In the case that a semiconductor laser device having a layering structure as described above is driven under a high output condition, dark line failure due to the optical absorption by the laser facet, which has a plurality of surface states, and a phenomenon called facet destruction, become more likely to occur. Both of these defects hinder the improvement of reliability in semiconductor laser devices, and also act as an obstacle to high output operation thereof.

A method that is commonly employed to solve the problem mentioned above and to stably operate a semiconductor laser device at high output is to reduce the optical power density at the active layer. Commonly, $d/\Gamma$, which is the thickness of the active layer d divided by the coefficient of optical confinement $\Gamma$, is utilized as a parameter that represents the optical power density. It can be said that the larger the value of $d/\Gamma$, the smaller the optical power density.

If the thickness of active layer d is increased, by the increase of threshold current density, the characteristics of the semiconductor laser device drastically deteriorate. Therefore, the range within which control is possible becomes extremely narrow, thus it is not preferable as a parameter to be altered. On the other hand, it is possible to regulate the coefficient of optical confinement $\Gamma$ by altering as parameters the thickness of the optical waveguide layer as well as the composition of the AlGaAs, which is the cladding layer, without a large deterioration in the characteristics of the semiconductor laser. Although some change occurs in the shape of a far field pattern by altering $\Gamma$, it is known that it is possible to obtain a desired far field pattern by selecting an appropriate thickness for the optical waveguide layer and an appropriate cladding composition, at a low optical power density.

SUMMARY OF THE INVENTION

The present invention has been developed in view of the above circumstances, and an object of the present invention is to provide a semiconductor laser device in which the temperature dependence of the threshold current is improved, and which has improved reliability even at high output.

The first semiconductor laser device according to the present invention comprises: a compressive-strain active layer made of $In_{x3}Ga_{1-x3}As_{1-y3}P_{y3}$ ($0<x3\leq0.4$ and $0\leq y3\leq0.1$); and an optical waveguide layer made of $In_{0.49}Ga_{0.51}P$, and that lattice-matches with GaAs on both the upper and lower sides of the active layer; wherein tensile-strain barrier layers made of $In_{x2}Ga_{1-x2}As_{1-y2}P_{1-y2}$ ($0\leq x2<0.49y2$ and $0<y2\leq0.4$) are provided between the active layer and the optical waveguide layers In the first semiconductor laser device according to the present invention, an absolute value of a sum of a first product and a second product may be equal to or smaller than 0.25 nm, where the first product is a product of a strain and a thickness of the compressive-strain active layer, and the second product is a product of a strain of the lower and upper tensile-strain barrier layers and a total thickness of the lower and upper tensile-strain barrier layers.

The second semiconductor laser device according to the present invention comprises: a GaAs substrate of a first conductive type; a lower cladding layer of the first conductive type, formed above the GaAs substrate; a lower optical waveguide layer formed above the lower cladding layer and made of $In_{0.49}Ga_{0.51}P$ which is undoped or of the first conductive type; a lower tensile-strain barrier layer made of $In_{x2}Ga_{1-x2}As_{1-y2}P_{1-y2}$ ($0\leq x2<0.49y2$ and $0<y2\leq0.4$) and formed above the lower optical waveguide layer; a compressive-strain active layer made of $In_{x3}Ga_{1-x3}As_{1-y3}P_{y3}$ ($0<x3\leq0.4, 0<y3\leq0.1$) and formed on the lower tensile-strain barrier layer; an upper and formed above the compressive-strain active layer; an upper optical waveguide layer formed above the upper tensile-strain barrier layer and made of $In_{0.49}Ga_{0.51}P$ which is undoped or of a second conductive type; an etching stop layer made of GaAs of the second conductive type and formed on the upper optical waveguide layer; a current confinement layer made of $In_{0.49}(Al_{z2}Ga_{1-z2})_{0.51}P$ ($0.15\leq z2\leq1$) of the first conductive type and formed on the etching stop layer; a cap layer made of $In_{0.49}Ga_{0.51}P$ of the first conductive type or the second conductive type and formed above the current confinement layer; an upper cladding layer of the second conductive type, formed over the cap layer; and a contact layer made of GaAs of the second conductive type and formed above the upper cladding layer. A portion of the semiconductor layer formed by the cap layer, the current confinement layer, as well as the etching stop layer are removed from one resonator facet to the other that faces it from the resonator formed by the layers described above, to a depth at which the optical waveguide layer formed of $In_{0.49}Ga_{0.51}P$ which is undoped or of a second conductive type is exposed. The groove formed thereby is filled by the cladding layer of the second conductive type formed above the cap layer to form a refractive index waveguide structure. In the above semiconductor laser device, an absolute value of a sum of a first product and a second product is less than or equal to 0.25 nm, where the first product is a product of a strain and a thickness of the compressive-strain active layer, and the second product is a product of a strain of the lower and upper tensile-strain barrier layers and a total thickness of the lower and upper tensile-strain barrier layers.

With regard to the second semiconductor laser of the present invention, it is preferable that the cladding layer of the second conductive type be composed of either $Al_{z1}Ga_{1-z1}As$ $(0.6 \leq z1 \leq 0.8)$ or $In_{0.49}(Ga_{1-z3}Al_{z3})_{0.51}P$ $(0.1 \leq z3 < z2)$.

The third semiconductor laser device according to the present invention comprises: a GaAs substrate of a first conductive type; a lower cladding layer of the first conductive type, formed above the GaAs substrate; a lower optical waveguide layer made of $In_{0.49}Ga_{0.51}P$ which is undoped or of the first conductive type formed above the lower cladding layer; a lower tensile-strain barrier layer made of $In_{x2}Ga_{1-x2}As_{1-y2}P_{1-y2}$ $(0 \leq x2 < 0.49y2$ and $0 < y2 \leq 0.4)$ formed above the lower optical waveguide layer; a compressive-strain active layer made of $In_{x3}Ga_{1-x3}As_{1-y3}P_{y3}$ $(0 < x3 \leq 0.4$ and $0 \leq y3 \leq 0.1)$ formed on the lower tensile-strain barrier layer; an upper tensile-strain barrier layer made of $In_{x2}Ga_{1-x2}As_{1-y2}P_{1-y2}$ $(0 \leq x2 < 0.49y2$ and $0 < y2 \leq 0.4)$ formed above the compressive-strain active layer; an upper optical waveguide layer made of $In_{0.49}Ga_{0.51}P$ which is undoped or a second conductive type formed above the upper tensile-strain barrier layer; a first upper cladding layer of the second conductive type, formed over the upper optical waveguide layer; a first etching stop layer made of InGaP of the second conductive type and formed on the first upper cladding layer; a second etching stop layer made of GaAs of either the first or second conductive type and formed on the first etching stop layer; a current confinement layer made of $In_{0.49}(Al_{z2}Ga_{1-z2})_{0.51}P$ $(0.15 \leq Z2 \leq 1)$ of the first conductive type and formed on the second etching stop layer; a cap layer made of $In_{0.49}Ga_{0.51}P$ of the first conductive type or the second conductive type and formed above the current confinement layer; a second upper cladding layer of the second conductive type, formed over the cap layer; and a contact layer made of GaAs of the second conductive type and formed above the second upper cladding layer. A portion of the semiconductor layer formed by the cap layer, the current confinement layer, as well as the second etching stop layer are removed from one resonator facet to the other that faces it from the resonator formed by the layers described above, to a depth at which the first etching stop layer is exposed. The groove formed thereby is filled by the second cladding layer of the second conductive type formed above the cap layer to form a refractive index waveguide structure. In the above semiconductor laser device, an absolute value of a sum of a first product and a second product is equal to or smaller than 0.25 nm, where the first product is a product of a strain and a thickness of the compressive-strain active layer, and the second product is a product of a strain of the lower and upper tensile-strain barrier layers and a total thickness of the lower and upper tensile-strain barrier layers.

With regard to the third semiconductor laser of the present invention, it is preferable that the first and second cladding layers of the second conductive type be composed of either $Al_{z1}Ga_{1-z1}As$ $(0.6 \leq z1 \leq 0.8)$ or $In_{0.49}(Ga_{1-z3}Al_{z3})_{0.51}P$ $(0.1 \leq z3 < z2)$.

In a semiconductor laser device of an internal confinement type with a refractive index waveguide structure that provides an internal groove as a path for a current like the second or third semiconductor laser of the present invention, in the case that the width of the groove is 1–4 μm, it is preferable that the equivalent refractive index step be 1.5× $10^{-3}$–7×$10^{-3}$. In the case that the width of the groove is larger than 4 μm, it is preferable that the equivalent refractive index step be greater than or equal to 1.5×$10^{-3}$. The fourth semiconductor laser device according to the present invention comprises: a GaAs substrate of a first conductive type; a lower cladding layer of the first conductive type, formed above the GaAs substrate; a lower optical waveguide layer made of $In_{0.49}Ga_{0.51}P$ which is undoped or of the first conductive type formed above the lower cladding layer; a lower tensile-strain barrier layer made of $In_{x2}Ga_{1-x2}As_{1-y2}P_{1-y2}$ $(0 \leq x2 < 0.49y2$ and $0 < y2 \leq 0.4)$ formed above the lower optical waveguide layer; a compressive-strain active layer made of $In_{x3}Ga_{1-x3}As_{1-y3}P_{y3}$ $(0 < x3 \leq 0.4$ and $0 \leq y3 \leq 0.1)$ formed on the lower tensile-strain barrier layer; an upper tensile-strain barrier layer made of $In_{x2}Ga_{1-x2}As_{1-y2}P_{1-y2}$ $(0 \leq x2 < 0.49y2$ and $0 < y2 \leq 0.4)$ formed above the compressive-strain active layer; an upper optical waveguide layer made of $In_{0.49}Ga_{0.51}P$ which is undoped or a second conductive type formed above the upper tensile-strain barrier layer; an upper cladding layer of the second conductive type formed on the upper optical waveguide layer; and a contact layer made of GaAs of the second conductive type and formed above the upper cladding layer. Two separate grooves are formed from one resonator facet to the other that faces it from the resonator formed by the layers described above, to a depth at which the optical waveguide layer formed of $In_{0.49}Ga_{0.51}P$ which is undoped or of a second conductive type is exposed. The ridge formed therebetween forms a refractive index waveguide structure. In the above semiconductor laser device, an absolute value of a sum of a first product and a second product is equal to or smaller than 0.25 nm, where the first product is a product of a strain and a thickness of the compressive-strain active layer, and the second product is a product of a strain of the lower and upper tensile-strain barrier layers and a total thickness of the lower and upper tensile-strain barrier layers.

With regard to the fourth semiconductor laser of the present invention, it is preferable that the cladding layer of the second conductive type be composed of either $Al_{z1}Ga_{1-z1}As$ $(0.6 \leq z1 \leq 0.8)$ or $In_{0.49}(Ga_{1-z3}Al_{z3})_{0.51}P$ $(0.1 \leq z3 < z2)$.

Note that an etching stop layer may be provided between the optical waveguide layer made of $In_{0.49}Ga_{0.51}P$ which is undoped or of the second conductive type and the cladding layer of the second conductive type. In the case that such an etching stop layer is provided, it is preferable that said etching stop layer be exposed at the bottom of the groove. Further, in this case, if the cladding layer of the second conductive type is composed of $Al_{z1}Ga_{1-z1}As$ $(0.6 \leq z1 \leq 0.8)$, it is preferable that the etching stop layer be composed of $In_{0.49}Ga_{0.51}P$, and if the cladding layer of the second conductive type is composed of $In_{0.49}(Ga_{1-z3}Al_{z3})_{0.51}P$ $(0.1 \leq z3 < z2)$, it is preferable that the etching stop layer be composed of GaAs.

The fifth semiconductor laser device according to the present invention comprises: a GaAs substrate of a first conductive type; a lower cladding layer of the first conductive type, formed above the GaAs substrate; a lower optical waveguide layer made of $In_{0.49}Ga_{0.51}P$ which is undoped or of the first conductive type formed above the lower cladding layer; a lower tensile-strain barrier layer made of $In_{x2}Ga_{1-x2}As_{1-y2}P_{1-y2}$ $(0 \leq x2 < 0.49y2$ and $0 < y2 \leq 0.4)$ formed above the lower optical waveguide layer; a compressive-strain active layer made of $In_{x3}Ga_{1-x3}As_{1-y3}P_{y3}$ ($0<x3\leq0.4$ and $0\leq y3\leq0.1$) formed on the lower tensile-strain barrier layer; an upper tensile-strain barrier layer made of $In_{x2}Ga_{1-x2}As_{1-y2}P_{1-y2}$ ($0\leq x2<0.49y2$ and $0<y2\leq0.4$) formed above the compressive-strain active layer; an upper optical waveguide layer made of $In_{0.49}Ga_{0.51}P$ which is undoped or a second conductive type formed above the upper tensile-strain barrier layer; a first upper cladding layer of the second conductive type, formed over the upper optical waveguide layer; an etching stop layer made of InGaP of the second conductive type and formed on the first upper cladding layer; a second upper cladding layer of the second conductive type, formed on the etching stop layer; and a contact layer made of GaAs of the second conductive type and formed above the second upper cladding layer. Two separate grooves are formed from one resonator facet to the other that faces it from the resonator formed by the layers described above, to a depth at which the etching stop layer is exposed. The ridge formed therebetween forms a refractive index waveguide structure. In the above semiconductor laser device, an absolute value of a sum of a first product and a second product is equal to or smaller than 0.25 nm, where the first product is a product of a strain and a thickness of the compressive-strain active layer, and the second product is a product of a strain of the lower and upper tensile-strain barrier layers and a total thickness of the lower and upper tensile-strain barrier layers.

With regard to the fifth semiconductor laser of the present invention, it is preferable that the first and second cladding layers of the second conductive type be composed of either $Al_{z1}Ga_{1-z1}As$ ($0.6\leq z1\leq0.8$) or $In_{0.49}(Ga_{1-z3}Al_{z3})_{0.51}P$ ($0.1\leq z3<z2$).

Further, if the first and second cladding layers of the second conductive type are composed of $Al_{z1}Ga_{1-z1}As$ ($0.6\leq z1\leq0.8$), it is preferable that the etching stop layer be composed of $In_{0.49}Ga_{0.51}P$, and if the first and second cladding layers of the second conductive type are composed of $In_{0.49}(Ga_{1-z3}Al_{z3})_{0.51}P$ ($0.1\leq z3<z2$), it is preferable that the etching stop layer be composed of GaAs.

With regard to the fourth and fifth semiconductor lasers according to the present invention, the two grooves may be formed to the isolative positions of the device. That is, both sides of the ridge may be removed to the isolative positions of the device.

In a semiconductor laser device of provided with a ridge type refractive index waveguide structure like the fourth or fifth semiconductor laser of the present invention, in the case that the width of the ridge bottom is 1–4 μm, it is preferable that the equivalent refractive index step be $1.5\times10^{-3}$–$7\times10^{-3}$. In the case that the width of the ridge bottom is larger than 4 μm, it is preferable that the equivalent refractive index step be greater than or equal to $1.5\times10^{-3}$.

With regard to each of the semiconductor laser devices of the present invention, it is preferable that the thickness of each of the optical waveguide layers is greater than or equal to 0.25 μm.

Further, each of the semiconductor laser devices of the present invention may also be provided with a layer of $In_{x4}Ga_{1-x4}As_{1-y4}P_{y4}$ ($x4=0.49y4\pm0.01$, $0<x4\leq0.3$) between the compressive-strain active layer of $In_{x3}Ga_{1-x3}As_{1-y3}P_{y3}$ ($0<x3\leq0.4$, $0\leq y3\leq0.1$) and the tensile-strain barrier layer of $In_{x2}Ga_{1-x2}As_{1-y2}P_{y2}$ ($0\leq x2<0.49y2$, $0<y2\leq0.4$). Said layer of $In_{x4}Ga_{1-x4}As_{1-y4}P_{y4}$ lattice matches with GaAs, and has a larger bandgap than the active layer.

Alternatively, a layer of $In_{x4}Ga_{1-x4}As_{1-y4}P_{y4}$ ($x4=0.49y4\pm0.01$, $0<x4\leq0.3$) may be provided between the tensile strain barrier layer of $In_{x2}Ga_{1-x2}As_{1-y2}P_{y2}$ and the optical waveguide layer. Said layer of $In_{x4}Ga_{1-x4}As_{1-y4}P_{y4}$ lattice matches with GaAs, and has a larger bandgap than the active layer.

If the lattice constant of GaAs is set to be cs, the lattice constant of the active layer is set to be ca, the film thickness is set to be da, the amount of compressive strain is set to be $\Delta a$, the lattice constant of the tensile-strain barrier layer is set to be cb, the total film thickness of the tensile-strain barrier layers is set to be db, and the amount of tensile strain is set to be $\Delta b$, then $\Delta a$ and $\Delta b$ are defined by $\Delta a=(ca-cs)/cs$ and $\Delta b=(cb-cs)/cs$, respectively. Therefore, that "an absolute value of a sum of a first product and a second product may be equal to or smaller than 0.25 nm, where the first product is a product of a strain and a thickness of the compressive-strain active layer, and the second product is a product of a strain of the lower and upper tensile-strain barrier layers and a total thickness of the lower and upper tensile-strain barrier layers" refers to a state in which $-0.25$ nm $\leq \Delta ada+\Delta bdb \leq 0.25$ nm Note that "lattice match" refers to a state in which the absolute value of the amount of strain is less than or equal to 0.005.

The "equivalent refractive index" is an equivalent refractive index in the active layer at the wavelength of oscillation in the thickness direction. In the case of the internal current confinement structure, when the equivalent refractive index of a region of the active layer located under the current confinement layer is denoted by na, and the equivalent refractive index of the other regions of the active layer located under the internal stripe is denoted by nb, the equivalent refractive index step, that is, the difference $\Delta n$ in the equivalent refractive index is defined by nb–na. In the case of the ridge structure, when the equivalent refractive index of a region of the active layer which is not located under the ridge is denoted by nA, and the equivalent refractive index of the other regions of the active layer located under the ridge is denoted by nB, the equivalent refractive index step, that is, the difference $\Delta N$ in the equivalent refractive index is nB–nA.

The "first conductive type" and the "second conductive type" have opposite polarities from each other. For example, if the first conductive type is an n-type, then the second conductive type is a p-type.

According to the semiconductor laser devices of the present invention, since the compressive strain in the $In_{x3}Ga_{1-x3}As_{1-y3}P_{y3}$ active layer can be compensated for by the tensile strain barrier layers provided both above and below said active layer, defects in the active layer can be reduced. Therefore, the quality and reliability of the semiconductor laser device are improved. Further, since the bandgap between the active layer and the optical waveguide layer is great, the leakage of carriers from the active layer due to temperature variations can be suppressed, and therefore the temperature dependence of the semiconductor laser device becomes very small.

By each of the optical waveguide layers being of a thickness greater than or equal to 0.25 μm, the optical power density can be reduced, and high reliability is obtained from low output to high output.

By the second conductive type cladding layers being made of $Al_{z1}Ga_{1-z1}As(0.6\leq Z1\leq0.8)$ or $In_{0.49}(Al_{z3}Ga_{1-z3})_{0.51}P(0.1\leq Z3\leq1)$, the bandgap between the upper cladding layer and the active layer in each semiconductor laser device can be increased. Therefore, the characteristics of the semiconductor laser device can be improved.

Further, by the second conductive type cladding layer being made of $Al_{z1}Ga_{1-z1}As$ and the etching stop layer being made of $In_{0.49}Ga_{0.51}P$, or the second conductive type cladding layer being made of $In_{0.49}(Al_{z3}Ga_{1-z3})_{0.51}P$ and the etching stop layer being made of GaAs, the cladding layer and the etching stop layer are respectively etched with different etchants with high selectivity. Therefore, the etching of the (second) upper cladding layer can be stopped at the upper surface of the etching stop layer with high precision, and the controllability of the stripe width is high.

By the current path in the internal or ridge stripe structure having a width of 1 to 4 μm and the equivalent refractive index step, that is, the difference in the equivalent refractive index between a portion of the compressive-strain active layer located under the ridge and other portions of the compressive-strain active layer being $1.5 \times 10^{-3}$ to $7 \times 10^{-3}$, the oscillation in the fundamental transverse mode can be maintained even when output power is increased to a high level.

By the current path in the internal or ridge stripe structure having a width greater than 4 μm and the equivalent refractive index step, that is, the difference in the equivalent refractive index between a portion of the compressive-strain active layer located under the ridge and other portions of the compressive-strain active layer being $1.5 \times 10^{-3}$ or greater, it is possible to realize a highly reliable semiconductor laser device which produces low noise even in a multimode operation.

DESCRIPTION OF THE DRAWINGS

FIG. 9 is a graph showing the results of a reliability test performed when an optical waveguide layer (one side) is of a thickness of 0.25 μm.

DESCRIPTION OF PREFERRED EMBODIMENTS

Embodiments of the present invention will be described in detail with reference to the accompanying drawings.

First Embodiment

Figure 1A:
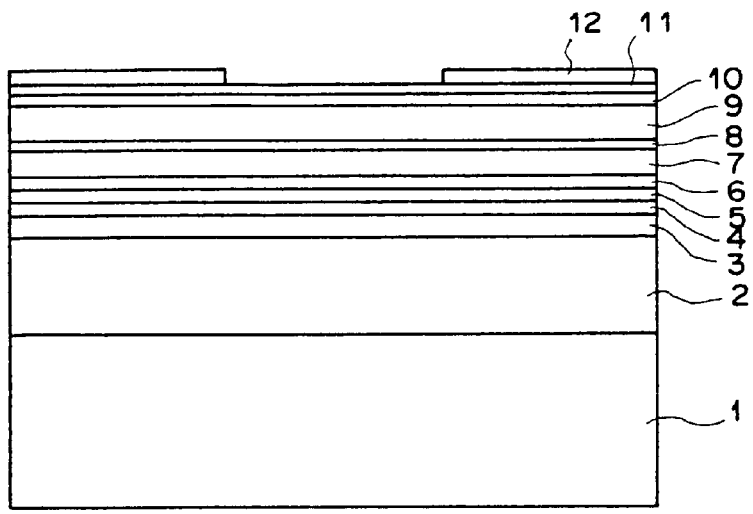
FIGS. 1A to 1C are cross-sectional views of representative stages in a process for producing a semiconductor laser device according to the first embodiment of the present invention.
Figure 1B:
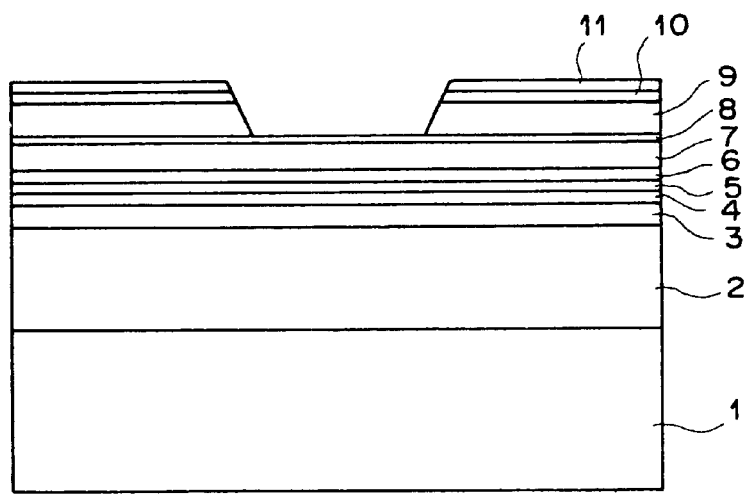
Figure 1C:
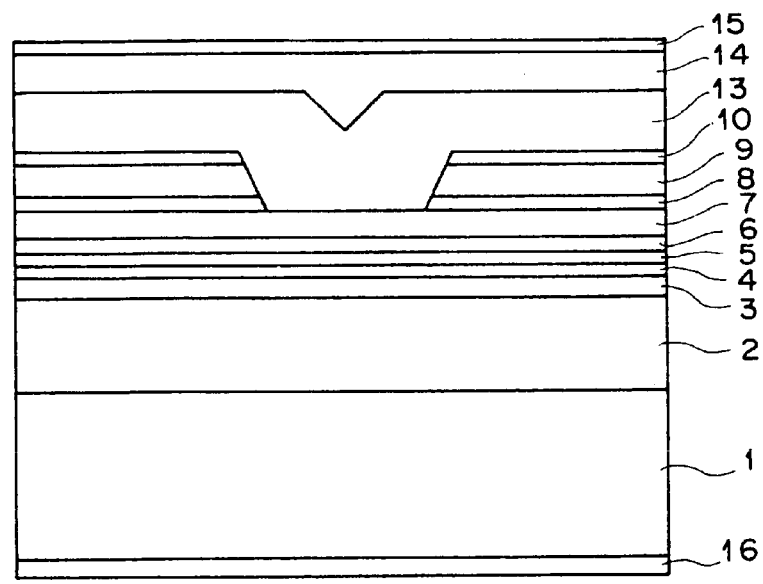

FIGS. 1A to 1C show cross sections of the representative stages in the process for producing a semiconductor laser device according to the first embodiment of the present invention.

First, as illustrated in FIG. 1A, an n-type $Al_{z1}Ga_{1-z1}As$ lower cladding layer 2 ($0.6 \leq z1 \leq 0.8$), an n-type or i-type (intrinsic) $In_{0.49}Ga_{0.51}P$ lower optical waveguide layer 3, an $In_{x2}Ga_{1-x2}As_{1-y2}P_{1-y2}$ tensile-strain barrier layer 4 ($0 \leq x2 < 0.49y2$ and $0 < y2 \leq 0.4$), an $In_{x3}Ga_{1-x3}As_{1-y3}P_{y3}$ compressive-strain active layer 5 ($0 < x3 \leq 0.4$, $0 \leq y3 \leq 0.1$), an $In_{x2}Ga_{1-x2}As_{1-y2}P_{1-y2}$ tensile-strain barrier layer 6, a p-type or i-type $In_{0.49}Ga_{0.51}P$ upper optical waveguide layer 7, a p-type GaAs etching stop layer 8 having a thickness of about 10 nm, an n-type $In_{0.49}(Al_{z2}Ga_{1-z2})_{0.51}P$ current confinement layer 9 ($0.15 \leq z2 \leq 1$) having a thickness of about 1 μm, an n-type $In_{0.49}Ga_{0.51}P$ first cap layer 10 having a thickness of about 10 nm, and an n-type GaAs second cap layer 11 having a thickness of about 10 nm are formed on an n-type GaAs substrate 1 by organometallic vapor phase epitaxy.

Then, a $SiO_2$ film 12 is formed over the n-type GaAs second cap layer 11, and a stripe area of the $SiO_2$ film 12 having a width of about 1 to 4 μm and extending in the <011> direction is removed by conventional lithography so that a stripe area of the n-type GaAs second cap layer 11 is exposed.

Next, as illustrated in FIG. 1B, the n-type GaAs second cap layer 11 is etched with a sulfuric acid etchant by using the $SiO_2$ film 12 as a mask so that a stripe area of the n-type $In_{0.49}Ga_{0.51}P$ first cap layer 10 is exposed. Then, the remaining areas of the $SiO_2$ film 12 are removed by etching with a fluoric acid etchant. Subsequently, the exposed stripe area of the n-type $In_{0.49}Ga_{0.51}P$ first cap layer 10 and a stripe area of the n-type $In_{0.49}(Al_{z2}Ga_{1-z2})_{0.51}P$ current confinement layer 9 under the stripe area of the n-type $In_{0.49}Ga_{0.51}P$ first cap layer 10 are etched with a hydrochloric acid etchant until a stripe area of the p-type GaAs etching stop layer 8 is exposed. Thus, a stripe groove is formed.

Thereafter, the exposed stripe area of the p-type GaAs etching stop layer 8 and the remaining areas of the n-type GaAs second cap layer 11 are etched off with a sulfuric acid etchant, and a p-type $Al_{z1}Ga_{1-z1}As$ upper cladding layer 13 and a p-type GaAs contact layer 14 are formed, as illustrated in FIG. 1C. Then, a p electrode 15 is formed over the p-type GaAs contact layer 14, the exposed (opposite) surface of the substrate 1 is polished, and an n electrode 16 is formed on the polished surface of the substrate 1. Finally, the above layered structure is cleaved at the positions of the end facets. Then, a high-reflection coating is laid on one of the end facets and a low-reflection coating is laid on the other end facet, and the construction processed as above is formed into a chip to complete the semiconductor laser device.

In the above construction, the thickness of the p-type or i-type $In_{0.49}Ga_{0.51}P$ upper optical waveguide layer 7 and the composition of the n-type $In_{0.49}(Al_{z2}Ga_{1-z2})_{0.51}P$ current confinement layer 9 are determined so that oscillation in the fundamental transverse mode can be maintained even when the semiconductor laser device operates with high output power.

The p-$Al_{z1}Ga_{1-z1}As$ cladding layer 13 may alternatively be made of $In_{0.49}(Al_{z3}Ga_{1-z3})_{0.51}P$ ($0.1 \leq z3 < z2$).

Further, the conductive type of the $In_{0.49}Ga_{0.51}P$ first cap layer 10, the GaAs second cap layer 11, and the GaAs etching stop layer 8 may be either n-type or p-type.

Temperature Dependence of Threshold Current

Figure 2:
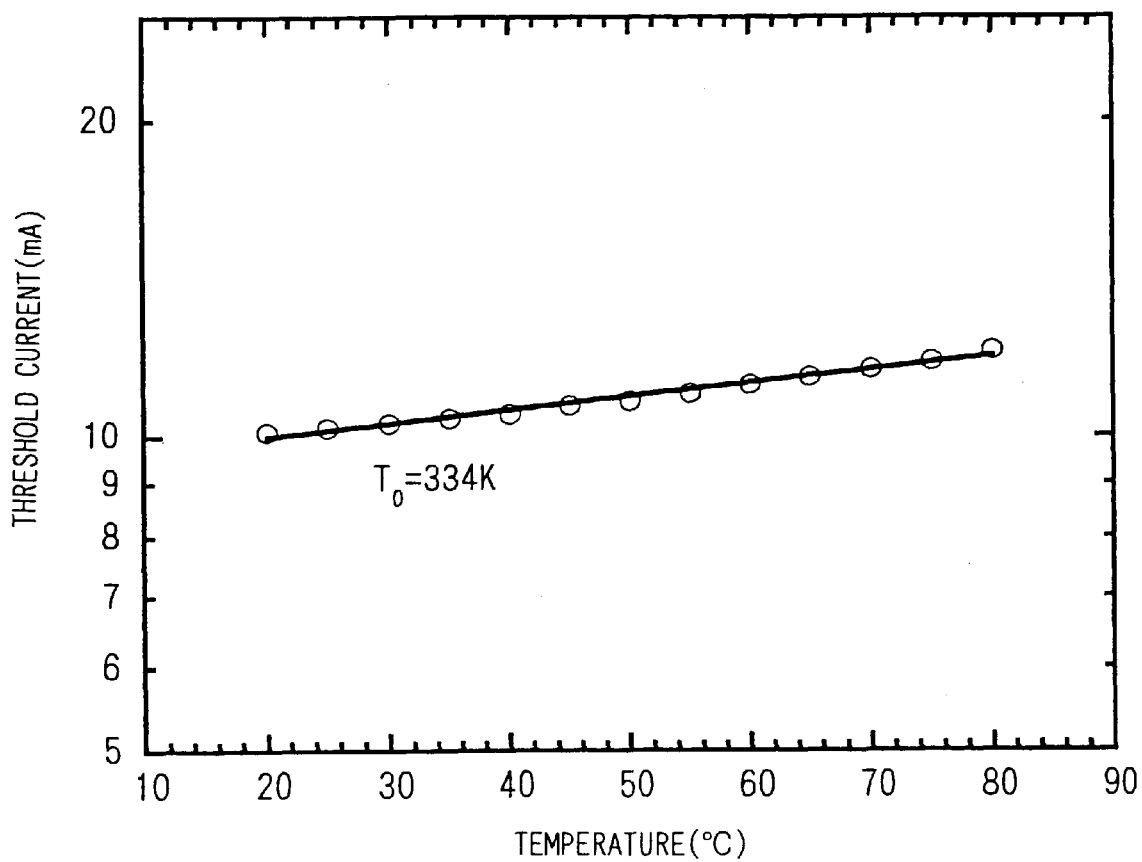
FIG. 2 is a graph indicating a temperature dependence of a threshold current of a semiconductor laser device according to the present invention.

FIG. 2 is a graph indicating a temperature dependence of a threshold current of a semiconductor laser device according to the present invention. The semiconductor laser device of FIG. 2 has a construction of the first embodiment, where the lower and upper cladding layers 2 and 13 have an Al composition z1 of 0.65, the upper and lower optical waveguide layers 7 and 3 have a total thickness of 200 nm, the tensile-strain barrier layers 4 and 6 have a composition y2 of 0.25, the $In_{x3}Ga_{1-x3}As_{1-y3}P_{y3}$ compressive-strain active layer 5 has a composition x3=0.25 and y3=0 and a thickness of 10 nm, and the n-type $In_{0.49}(Al_{z2}Ga_{1-z2})_{0.51}P$ current confinement layer 9 has an Al composition z2 of 0.4.

As illustrated in FIG. 2, a satisfactory characteristic temperature of greater than or equal to 330K is obtained from the plot of the threshold current in the range of 20 to 80° C., where the characteristic temperature indicates the temperature dependence of the threshold current. Since the leakage of carriers from the active layer to the optical waveguide layers is suppressed, the temperature dependence of the threshold current is greatly improved compared with the aforementioned characteristic temperature 156K of the conventional semiconductor laser device.

Second Embodiment

Figure 3:
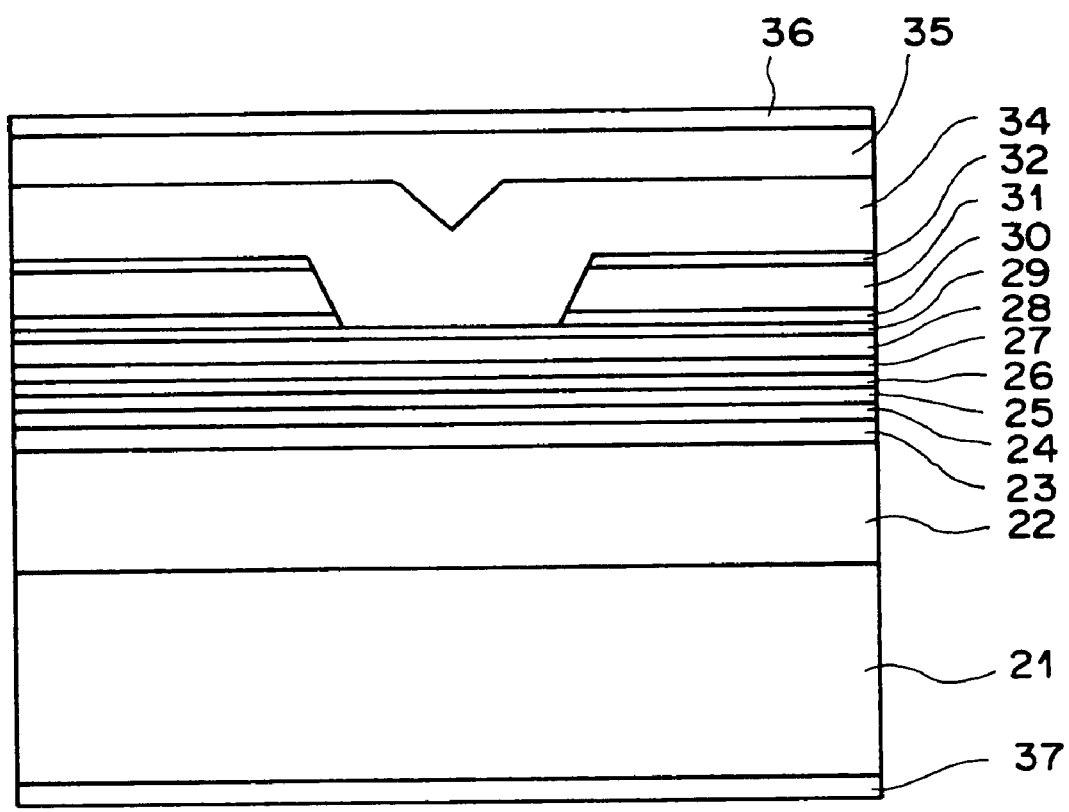
FIG. 3 is a cross-sectional view of a semiconductor laser device according to the second embodiment of the present invention.

FIG. 3 is a cross-sectional view of a semiconductor laser device according to the second embodiment of the present invention.

First, as illustrated in FIG. 3, an n-type $Al_{z1}Ga_{1-z1}As$ lower cladding layer 22 ($0.6 \leq z1 \leq 0.8$), an n-type or i-type (intrinsic) $In_{0.49}Ga_{0.51}P$ lower optical waveguide layer 23, an $In_{x2}Ga_{1-x2}As_{1-y2}P_{1-y2}$ tensile-strain barrier layer 24 ($0 \leq x2 < 0.49y2$ and $0 < y2 \leq 0.4$), an $In_{x3}Ga_{1-x3}As_{1-y3}P_{y3}$ compressive-strain quantum-well active layer 25 ($0 < x3 \leq 0.4$, $0 \leq y3 \leq 0.1$), an $In_{x2}Ga_{1-x2}As_{1-y2}P_{1-y2}$ tensile-strain barrier layer 26, a p-type or i-type $In_{0.49}Ga_{0.51}P$ upper optical waveguide layer 27, a p-type $Al_{z1}Ga_{1-z1}As$ first upper cladding layer 28, a p-type $In_{0.49}Ga_{0.51}P$ first etching stop layer 29 having a thickness of about 10 nm, a p-type GaAs second etching stop layer 30 having a thickness of about 10 nm, an n-type $In_{0.49}(Al_{z2}Ga_{1-z2})_{0.51}P$ current confinement layer 31 ($0.15 \leq z2 \leq 1$) having a thickness of about 1 μm, an n-type $In_{0.49}Ga_{0.51}P$ first cap layer 32, and an n-type GaAs second cap layer (not shown) are formed on an n-type GaAs substrate 21 by organometallic vapor phase epitaxy.

Then, a $SiO_2$ film (not shown) is formed over the n-type GaAs second cap layer, and a stripe area of the $SiO_2$ film having a width of about 1 to 4 μm and extending in the <011> direction is removed by conventional lithography so that a stripe area of the n-type GaAs second cap layer is exposed.

Next, the exposed stripe area of the n-type GaAs second cap layer is etched with a sulfuric acid etchant by using the $SiO_2$ film as a mask. Then, the remaining areas of the $SiO_2$ film are removed by etching with a fluoric acid etchant. Subsequently, the exposed stripe area of the n-type $In_{0.49}Ga_{0.51}P$ first cap layer 32 and a stripe area of the n-type $In_{0.49}(Al_{z2}Ga_{1-z2})_{0.51}P$ current confinement layer 31 under the stripe area of the n-type $In_{0.49}Ga_{0.51}P$ first cap layer 32 are etched with a hydrochloric acid etchant until a stripe area of the p-type GaAs second etching stop layer 30 is exposed. Thus, a stripe groove is formed.

Thereafter, the exposed stripe area of the p-type GaAs second etching stop layer 30 and the remaining areas of the n-type GaAs second cap layer are etched off with a sulfuric acid etchant, and a p-type $Al_{z1}Ga_{1-z1}As$ second upper cladding layer 34 and a p-type GaAs contact layer 35 are formed, as illustrated in FIG. 3. Then, a p electrode 36 is formed over the p-type GaAs contact layer 35, the exposed (opposite) surface of the substrate 21 is polished, and an n electrode 37 is formed on the polished surface of the substrate 21. Finally, the above layered structure is cleaved at the positions of the end facets. Then, a high-reflection coating is laid on one of the end facets, and a low-reflection coating is laid on the other end facet, and the construction processed as above is formed into a chip to complete the semiconductor laser device.

In the above construction, the thickness and composition of the p-type $Al_{z1}Ga_{1-z1}As$ first upper cladding layer 28 and the composition of the n-type $In_{0.49}(Al_{z2}Ga_{1-z2})_{0.51}P$ current confinement layer 31 are determined so that oscillation in the fundamental transverse mode can be maintained even when the semiconductor laser device operates with high output power.

The p-$Al_{z1}Ga_{1-z1}As$ first upper cladding layer 28 as well as the p-$Al_{z1}Ga_{1-z1}As$ second upper cladding layer 34 may alternatively be made of $In_{0.49}(Al_{z3}Ga_{1-z3})_{0.51}P$ ($0.1 \leq z3 < z2$).

Further, the conductive type of the $In_{0.49}Ga_{0.51}P$ first cap layer 32, the GaAs second cap layer 33, and the GaAs second etching stop layer 30 may be either n-type or p-type.

Third Embodiment

Figure 4:
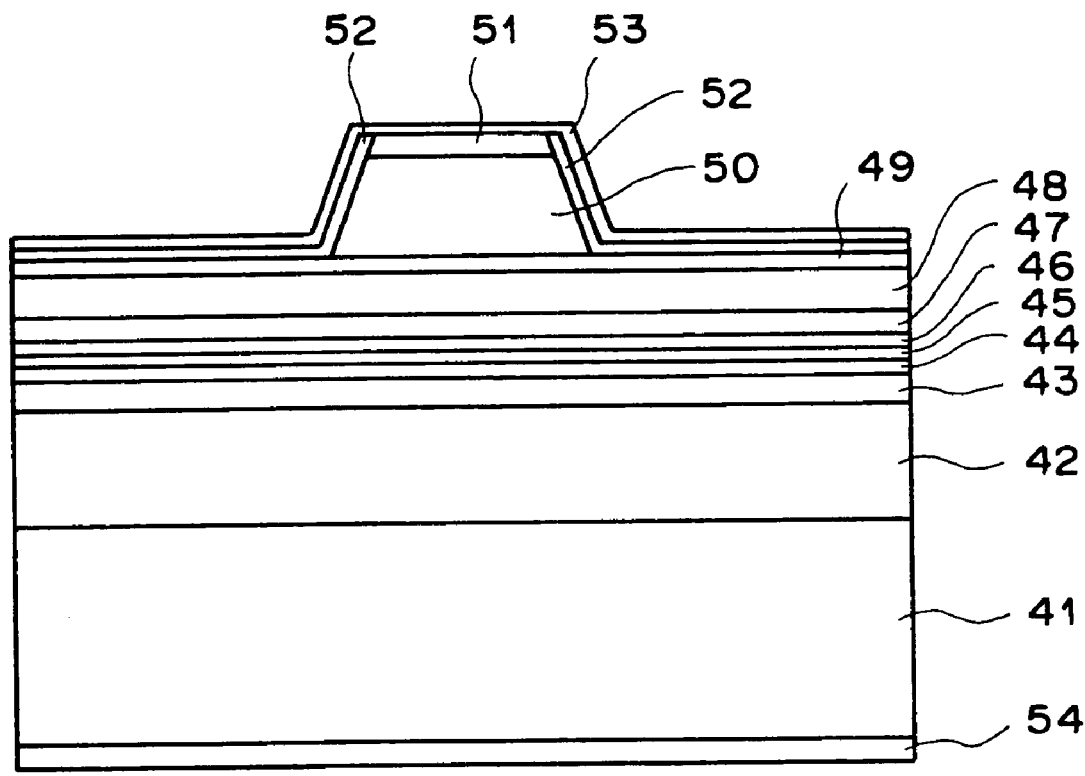
FIG. 4 is a cross-sectional view of a semiconductor laser device according to the third embodiment of the present invention.

FIG. 4 is a cross-sectional view of a semiconductor laser device according to the third embodiment of the present invention.

First, as illustrated in FIG. 4, an n-type $Al_{z1}Ga_{1-z1}As$ lower cladding layer 42 ($0.6 \leq z1 \leq 0.8$), an n-type or i-type (intrinsic) $In_{0.49}Ga_{0.51}P$ lower optical waveguide layer 43, a $GaAs_{1-y2}P_{y2}$ tensile-strain barrier layer 44 ($0 < y2 \leq 0.4$), an $In_{x3}Ga_{1-x3}As_{1-y3}P_{y3}$ compressive-strain quantum-well active layer 45 ($0 < x3 \leq 0.4$, $0 \leq y3 \leq 0.1$), a $GaAs_{1-y2}P_{y2}$ tensile-strain barrier layer 46, a p-type or i-type $In_{0.49}Ga_{0.51}P$ upper optical waveguide layer 47, a p-type $Al_{z1}Ga_{1-z1}As$ first upper cladding layer 48, a p-type $In_{0.49}Ga_{0.51}P$ etching stop layer 49 having a thickness of about 10 nm, a p-type $Al_{z1}Ga_{1-z1}As$ second upper cladding layer 50, and a p-type GaAs contact layer 51 are formed on an n-type GaAs substrate 41 by organometallic vapor phase epitaxy.

Next, a first $SiO_2$ film (not shown) is formed over the p-type GaAs contact layer 51, and the first $SiO_2$ film other than a stripe area having a width of about 4 μm and extending in the <011> direction is removed by conventional lithography so as to expose the p-type GaAs contact layer 51 other than a stripe portion under the stripe area of the first $SiO_2$ film.

Then, the exposed areas of the p-type GaAs contact layer 51 and portions of the p-type $Al_{z1}Ga_{1-z1}As$ second upper cladding layer 50 located under the exposed areas of the p-type GaAs contact layer 51 are etched off with a sulfuric acid etchant by using the first $SiO_2$ film as a mask. At this time, the etching automatically stops at the upper surface of the p-type $In_{0.49}Ga_{0.51}P$ etching stop layer 49. Thus, a ridge stripe structure is formed.

Thereafter, the remaining areas of the first $SiO_2$ film are removed by etching with a fluoric acid etchant. Then, a second $SiO_2$ film 52 is formed over the above construction, and a stripe area of the second $SiO_2$ film 52 on the top of the ridge stripe structure is removed by conventional lithography. Subsequently, a p electrode 53 is formed over the ridge stripe structure, the exposed (opposite) surface of the substrate 41 is polished, and an n electrode 54 is formed on the polished surface of the substrate 41. Finally, the above layered structure is cleaved at the positions of the end facets. Then, a high-reflection coating is laid on one of the end facets and a low-reflection coating is laid on the other end facet, and the construction processed as above is formed into a chip to complete the semiconductor laser device.

In the above construction, the thickness and composition of the p-type $Al_{z1}Ga_{1-z1}As$ first upper cladding layer 48 are determined so that oscillation in the fundamental transverse mode can be maintained even when the semiconductor laser device operates with high output power.

The p-$Al_{z1}Ga_{1-z1}As$ first upper cladding layer 48 as well as the p-$Al_{z1}Ga_{1-z1}As$ second upper cladding layer may alternatively be made of $In_{0.49}(Al_{z3}Ga_{1-z3})_{0.51}P$ ($0.1 \leq z3 < z2$). In this case, it is preferable that the etching stop layer 49 is made of GaAs.

Fourth Embodiment

Figure 5:
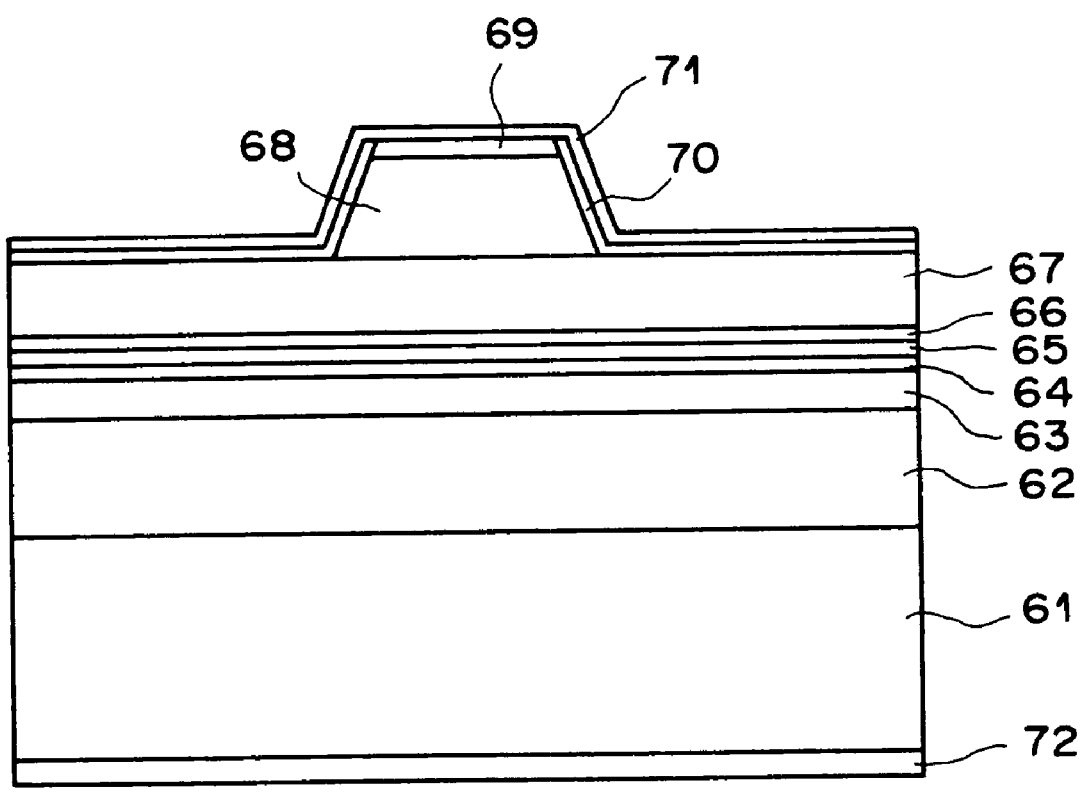
FIG. 5 is a cross-sectional view of a semiconductor laser device according to the fourth embodiment of the present invention.

FIG. 5 is a cross-sectional view of a semiconductor laser device according to the fourth embodiment of the present invention.

First, as illustrated in FIG. 5, an n-type $Al_{z1}Ga_{1-z1}As$ lower cladding layer 62 ($0.6 \leq z1 \leq 0.8$), an n-type or i-type (intrinsic) $In_{0.49}Ga_{0.51}P$ lower optical waveguide layer 63, an $In_{x2}Ga_{1-x2}As_{1-y2}P_{1-y2}$ tensile-strain barrier layer 64 ($0 \leq x2 < 0.49y2$ and $0 < y2 \leq 0.4$), an $In_{x3}Ga_{1-x3}As_{1-y3}P_{y3}$ compressive-strain quantum-well active layer 65 ($0 < x3 \leq 0.4$, $0 \leq y3 \leq 0.1$), an $In_{x2}Ga_{1-x2}As_{1-y2}P_{1-y2}$ tensile-strain barrier layer 66, a p-type or i-type $In_{0.49}Ga_{0.51}P$ upper optical waveguide layer 67, a p-type $Al_{z1}Ga_{1-z1}As$ upper cladding layer 68, and a p-type GaAs contact layer 69 are formed on an n-type GaAs substrate 61 by organometallic vapor phase epitaxy.

Next, a first $SiO_2$ film (not shown) is formed over the p-type GaAs contact layer 69, and the first $SiO_2$ film other than a stripe area having a width of about 4 μm and extending in the <011> direction is removed by conventional lithography so as to expose the p-type GaAs contact layer 69 other than a stripe portion under the stripe area of the first $SiO_2$ film.

Then, the exposed areas of the p-type GaAs contact layer 69 and portions of the p-type $Al_{z1}Ga_{1-z1}As$ upper cladding layer 68 located under the exposed areas of the p-type GaAs contact layer 69 are etched off with a sulfuric acid etchant by using the first $SiO_2$ film as a mask. At this time, the etching automatically stops at the upper surface of the p-type or i-type $In_{0.49}Ga_{0.51}P$ upper optical waveguide layer 67. Thus, a ridge stripe structure is formed.

Thereafter, the remaining areas of the first $SiO_2$ film are removed by etching with a fluoric acid etchant. Then, a second $SiO_2$ film 70 is formed over the above construction, and a stripe area of the second $SiO_2$ film 70 on the top of the ridge stripe structure is removed by conventional lithography. Subsequently, a p electrode 71 is formed over the ridge stripe structure, the exposed (opposite) surface of the substrate 61 is polished, and an n electrode 72 is formed on the polished surface of the substrate 61. Finally, the above layered structure is cleaved at the positions of the end facets. Then, a high-reflection coating is laid on one of the end facets and a low-reflection coating is laid on the other end facet, and the construction processed as above is formed into a chip to complete the semiconductor laser device.

In the above construction, the thickness of the $In_{0.49}Ga_{0.51}P$ upper optical waveguide layer 67 and the composition of the p-type $Al_{z1}Ga_{1-z1}As$ upper cladding layer 68 are determined so that oscillation in the fundamental transverse mode can be maintained even when the semiconductor laser device operates with high output power.

Further, an etching stop layer may be provided between the p-type or i-type $In_{0.49}Ga_{0.51}P$ upper optical waveguide layer 67 and the p-type $Al_{z1}Ga_{1-z1}As$ upper cladding layer 68.

Still further, the p-$Al_{z1}Ga_{1-z1}As$ upper cladding layer 68 may alternatively be made of $In_{0.49}(Al_{z3}Ga_{1-z3})_{0.51}P$ ($0.1 \leq z3 < z2$) In this case, it is preferable that the etching stop layer 49 is made of GaAs.

Fifth Embodiment

Figure 6:
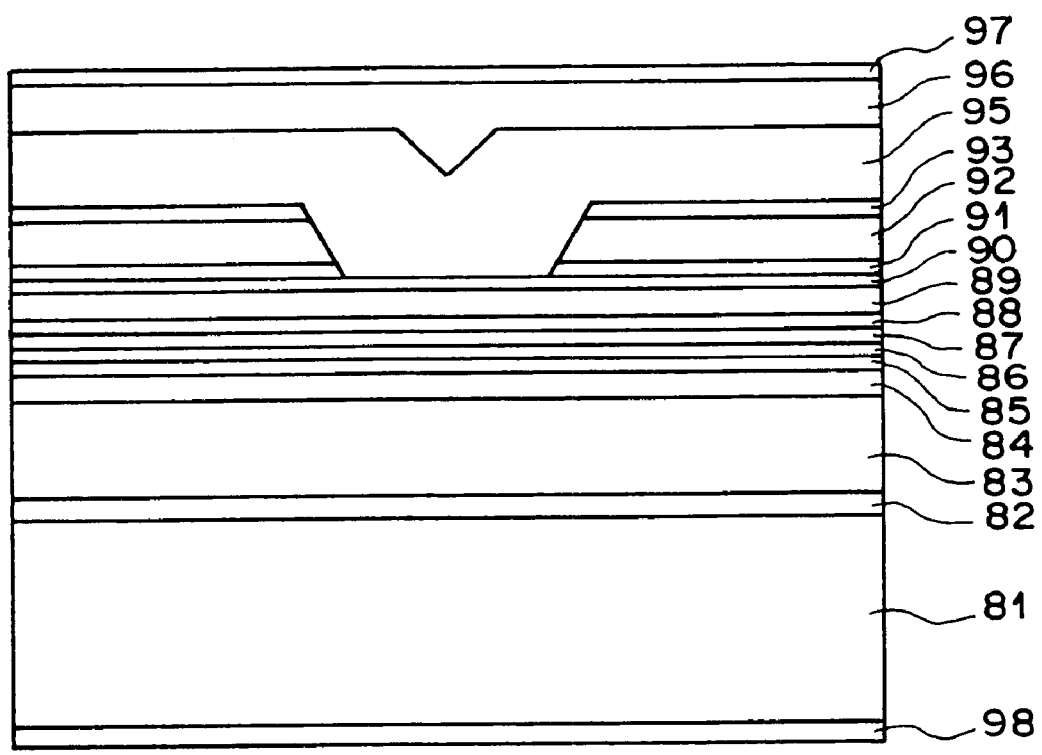
FIG. 6 is a cross-sectional view of a semiconductor laser device according to the fifth embodiment of the present invention.

FIG. 6 is a cross-sectional view of a semiconductor laser device according to the fifth embodiment of the present invention.

First, as illustrated in FIG. 6, an n-type GaAs buffer layer 82, an n-type $Al_{z1}Ga_{1-z1}As$ lower cladding layer 83 ($0.6 \leq z1 \leq 0.8$), an n-type or i-type (intrinsic) $In_{0.49}Ga_{0.51}P$ lower optical waveguide layer 84 (of a thickness greater than or equal to 0.25 μm), an $In_{x2}Ga_{1-x2}As_{1-y2}P_{1-y2}$ tensile-strain barrier layer 85 ($0 \leq x2 < 0.49y2$ and $0 < y2 \leq 0.4$), an $In_{x3}Ga_{1-x3}As_{1-y3}P_{y3}$ compressive-strain quantum-well active layer 86 ($0 < x3 \leq 0.4$, $0 \leq y3 \leq 0.1$), an $In_{x2}Ga_{1-x2}As_{1-y2}P_{1-y2}$ tensile-strain barrier layer 87, a p-type or i-type $In_{0.49}Ga_{0.51}P$ upper optical waveguide layer 88 (of a thickness greater than or equal to 0.25 μm), a p-type $Al_{z1}Ga_{1-z1}As$ first upper cladding layer 89, a p-type $In_{0.49}Ga_{0.51}P$ first etching stop layer 90 (of a thickness of about 10 nm), a p-type GaAs second etching stop layer 91 (of a thickness of about 10 nm), an n-type $In_{0.49}(Al_{z2}Ga_{1-z2})_{0.51}P$ current confinement layer 92 ($0.15 \leq z2 \leq 1$, of a thickness of 100–600 nm), an n-type $In_{0.49}Ga_{0.51}P$ first cap layer 93 (of a thickness of about 10 nm)), and an n-type GaAs second cap layer 94 (not shown, of a thickness of about 10 nm) are formed on an n-type GaAs substrate 81 by organometallic vapor phase epitaxy.

Next, an $SiO_2$ film (not shown) is formed over the n-type GaAs second cap layer 94, and a stripe area of the $SiO_2$ film having a width of about 4 μm and extending in the <011> direction is removed by conventional lithography so as to expose a stripe area of the n-type GaAs second cap layer 94.

Next, the exposed stripe area of the n-type GaAs second cap layer 94 is etched with a sulfuric acid etchant by using the $SiO_2$ film as a mask. Then, the remaining areas of the $SiO_2$ film are removed by etching with a fluoric acid etchant. Subsequently, the exposed stripe area of the n-type $In_{0.49}Ga_{0.51}P$ first cap layer 93 and a stripe area of the n-type $In_{0.49}(Al_{z2}Ga_{1-z2})_{0.51}P$ current confinement layer 92 under the stripe area of the n-type $In_{0.49}Ga_{0.51}P$ first cap layer 93 are etched with a hydrochloric acid etchant until a stripe area of the p-type GaAs second etching stop layer 91 is exposed. Thus, a stripe groove is formed.

Thereafter, the exposed stripe area of the p-type GaAs second etching stop layer 91 and the remaining areas of the n-type GaAs second cap layer 94 are etched off with a sulfuric acid etchant, and a p-type $Al_{z1}Ga_{1-z1}As$ second upper cladding layer 95 and a p-type GaAs contact layer 96 are formed. Then, a p electrode 97 is formed over the p-type GaAs contact layer 96, the exposed (opposite) surface of the substrate 81 is polished, and an n electrode 98 is formed on the polished surface of the substrate 81. Finally, the above layered structure is cleaved at the positions of the end facets. Then, a high-reflection coating is laid on one of the end facets, and a low-reflection coating is laid on the other end facet, and the construction processed as above is formed into a chip to complete the semiconductor laser device.

The thickness of the p-type $Al_{z1}Ga_{1-z1}As$ first upper cladding layer 89 and the composition of the n-type $In_{0.49}(Al_{z2}Ga_{1-z2})_{0.51}P$ current confinement layer 92 are determined so that oscillation in the fundamental transverse mode can be maintained even when the semiconductor laser device operates with high output power.

Note that in order to maintain oscillation in the fundamental transverse mode through high output, it is necessary that the equivalent refractive index step be $1.5 \times 10^{-3}$–$7 \times 10^{-3}$. In the case that the equivalent refractive index step is made to be $1.5 \times 10^{-3}$–$7 \times 10^{-3}$ by appropriate selection of the composition of the current confinement layer 92, the thickness of the p-type $Al_{z1}Ga_{1-z1}As$ first upper cladding layer 89 may be zero.

Further, in order to smoothly perform gas switching at the active layer interface, a layer of $In_{x4}Ga_{1-x4}As_{1-y4}P_{y4}$ (x4=0.49y4±0.01, 0<x4≦0.3, of a thickness of about 5 nm) may be provided between the active layer and the tensile-strain barrier layer, wherein said layer of $In_{x4}Ga_{1-x4}As_{1-y4}P_{y4}$ lattice matches with GaAs, and has a larger bandgap than the active layer. Alternatively, a layer of $In_{x4}Ga_{1-x4}As_{1-y4}P_{y4}$ (x4=0.49y4±0.01, 0<x4≦0.3, of a thickness of about 5 nm) may be provided between the tensile-strain barrier layer and the optical waveguide layer, wherein said layer of $In_{x4}Ga_{1-x4}As_{1-y4}P_{y4}$ lattice matches with GaAs, and has a larger bandgap than the active layer.

The p-type $Al_{z1}Ga_{1-z1}As$ first upper cladding layer 89 as well as the p-type $Al_{z1}Ga_{1-z1}As$ second upper cladding layer 95 may alternatively be made of $In_{0.49}(Al_{z3}Ga_{1-z3})_{0.51}P$ (0.1≦z3<z2).

The conductive type of the $In_{0.49}Ga_{0.51}P$ first cap layer 93, the GaAs second cap layer 94, as well as the GaAs etching stop layer 91 may be either n-type or p-type.

The semiconductor laser device according to the present embodiment, when compared to the layering structure of the internal current confinement semiconductor laser device of the second embodiment, differs in the points that each of the optical waveguide layers has been made to be of a thickness greater than or equal to 0.25 μm, and that a GaAs buffer layer 82 has been provided between the GaAs substrate 81 and the n-type $Al_{z1}Ga_{1-z1}As$ lower cladding layer 83. By making the thicknesses of each of the optical waveguide layers greater than or equal to 0.25 μm, the optical power density is reduced as will be described below, and high reliability can be obtained through high output. Further, by providing a buffer layer, crystal defects that occur in the cladding layer can also be reduced.

Sixth Embodiment

Figure 7:
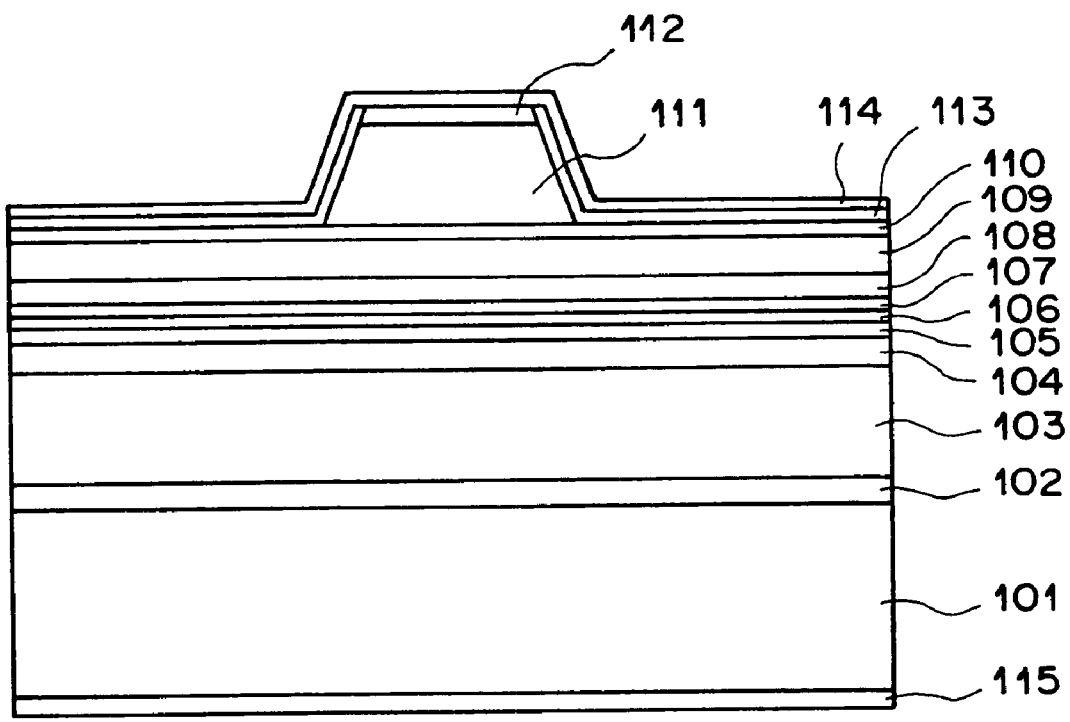
FIG. 7 is a cross-sectional view of a semiconductor laser device according to the sixth embodiment of the present invention.

FIG. 7 shows a cross-sectional view of a semiconductor laser device according to the sixth embodiment of the present invention.

First, as illustrated in FIG. 7, an n-type GaAs buffer layer 102, an n-type $Al_{z1}Ga_{1-z1}As$ lower cladding layer 103 (0.6≦z1≦0.8), an n-type or i-type (intrinsic) $In_{0.49}Ga_{0.51}P$ lower optical waveguide layer 104 (of a thickness greater than or equal to 0.25 μm), an $In_{x2}Ga_{1-x2}As_{1-y2}P_{1-y2}$ tensile-strain barrier layer 105 (0≦x2<0.49y2 and 0<y2≦0.4), an $In_{x3}Ga_{1-x3}As_{1-y3}P_{y3}$ compressive-strain quantum-well active layer 106 (0<x3≦0.4, 0≦y3≦0.1), an $In_{x2}Ga_{1-x2}As_{1-y2}P_{1-y2}$ tensile-strain barrier layer 107, a p-type or i-type $In_{0.49}Ga_{0.51}P$ upper optical waveguide layer 108 (of a thickness greater than or equal to 0.25 μm), a p-type $Al_{z1}Ga_{1-z1}As$ first upper cladding layer 109, a p-type $In_{0.49}Ga_{0.51}P$ etching stop layer 110 (of a thickness of about 10 nm), a p-type $Al_{z1}Ga_{1-z1}As$ second upper cladding layer 111, and a p-type GaAs contact layer 112 are formed on an n-type GaAs substrate 101 by organometallic vapor phase epitaxy.

Next, a first $SiO_2$ film (not shown) is formed over the p-type GaAs contact layer 112, and the first $SiO_2$ film other than a stripe area having a width of about 4 μm and extending in the <011> direction is removed by conventional lithography so as to expose the p-type GaAs contact layer 112 other than a stripe portion under the stripe area of the first $SiO_2$ film.

Then, the exposed areas of the p-type GaAs contact layer 112 and portions of the p-type $Al_{z1}Ga_{1-z1}As$ second upper cladding layer 111 located under the exposed areas of the p-type GaAs contact layer 112 are etched off with a sulfuric acid etchant by using the first $SiO_2$ film as a mask. At this time, the etching automatically stops at the upper surface of the p-type $In_{0.49}Ga_{0.51}P$ etching stop layer 110. Thus, a ridge stripe structure is formed.

Thereafter, the remaining areas of the first $SiO_2$ film are removed by etching with a fluoric acid etchant. Then, a second $SiO_2$ film 113 is formed over the above construction, and a stripe area of the second $SiO_2$ film 113 on the top of the ridge stripe structure is removed by conventional photolithography. Subsequently, a p electrode 114 is formed over the ridge stripe structure, the exposed (opposite) surface of the substrate 101 is polished, and an n electrode 115 is formed on the polished surface of the substrate 101. Finally, the above layered structure is cleaved at the positions of the end facets. Then, a high-reflection coating is laid on one of the end facets and a low-reflection coating is laid on the other end facet, and the construction processed as above is formed into a chip to complete the semiconductor laser device.

In the above construction, the thickness and composition of the p-type $Al_{z1}Ga_{1-z1}As$ first upper cladding layer 109 are determined so that oscillation in the fundamental transverse mode can be maintained even when the semiconductor laser device operates with high output power. That is, said composition is selected so that the equivalent refractive index step is $1.5 \times 10^{-3}$–$7 \times 10^{-3}$. As a result, the thickness of the p-type $Al_{z1}Ga_{1-z1}As$ first upper cladding layer may be zero.

Further, in order to smoothly perform gas switching at the active layer interface, a layer of $In_{x4}Ga_{1-x4}As_{1-y4}P_{y4}$ (x4=0.49y4±0.01, 0<x4≦0.3, of a thickness of about 5 nm) may be provided between the active layer and the tensile-strain barrier layer, wherein said layer of $In_{x4}Ga_{1-x4}As_{1-y4}P_{y4}$ lattice matches with GaAs, and has a larger bandgap than the active layer. Alternatively, a layer of $In_{x4}Ga_{1-x4}As_{1-y4}P_{y4}$ (x4=0.49y4±0.01, 0<x4≦0.3, of a thickness of about 5 nm) may be provided between the tensile-strain barrier layer and the optical waveguide layer, wherein said layer of $In_{x4}Ga_{1-x4}As_{1-y4}P_{y4}$ lattice matches with GaAs, and has a larger bandgap than the active layer.

The p-type $Al_{z1}Ga_{1-z1}As$ first upper cladding layer 109 as well as the p-type $Al_{z1}Ga_{1-z1}As$ second upper cladding layer 111 may alternatively be made of $In_{0.49}(Al_{z3}Ga_{1-z3})_{0.51}P$ (0.1≦z3<z2). In this case, a GaAs etching stop layer may be employed.

The semiconductor laser device according to the present embodiment, when compared to the semiconductor laser device of the third embodiment, differs in the points that each of the optical waveguide layers has been made to be of a thickness greater than or equal to 0.25 μm, and that a GaAs buffer layer 102 has been provided between the GaAs substrate 101 and the n-type $Al_{z1}Ga_{1-z1}As$ lower cladding layer 103. By making the thicknesses of each of the optical waveguide layers greater than or equal to 0.25 μm, the optical power density is reduced as will be described below, and high reliability can be obtained through high output. Further, by providing a buffer layer, crystal defects that occur in the cladding layer can also be reduced, thereby improving reliability.

In all of the preceding embodiments, the GaAs substrate which has been described has been of an n-type. However, a substrate of a p-conductive type may be employed; in this case, all of the above described conductive types should be reversed.

In addition, in all of the preceding embodiments, semiconductor laser devices having a stripe width of 1–4 μm that oscillate in the fundamental transverse mode have been described. However, the stripe width can be made greater than 4 μm, and a refractive index waveguide type broad area semiconductor laser that exhibits low noise even during multimode oscillation may also be obtained.

Further, in all of the preceding embodiments, it is possible to control the oscillating wavelength band λ within a range of 900 nm<λ<1200 nm by the $In_{x3}Ga_{1-x3}As_{1-y3}P_{y3}$ compression strain active layer ($0<x3\leq0.4$, $0\leq y3\leq0.1$).

As a growth method for each of the semiconductor it layers, molecular beam epitaxy using either solids or gas as raw material may be employed.

In all of the preceding embodiments, semiconductor lasers having refractive index waveguide structures have been described. However, the present invention may be utilized in semiconductor lasers having a diffraction grating, or in optical integration circuits as well. As the semiconductor laser device of the present invention has high reliability through high output, it may be applied as a light source in the fields of high speed data/image processing, high speed data/image transmission, measuring, medicine, and printing.

Figure 8:
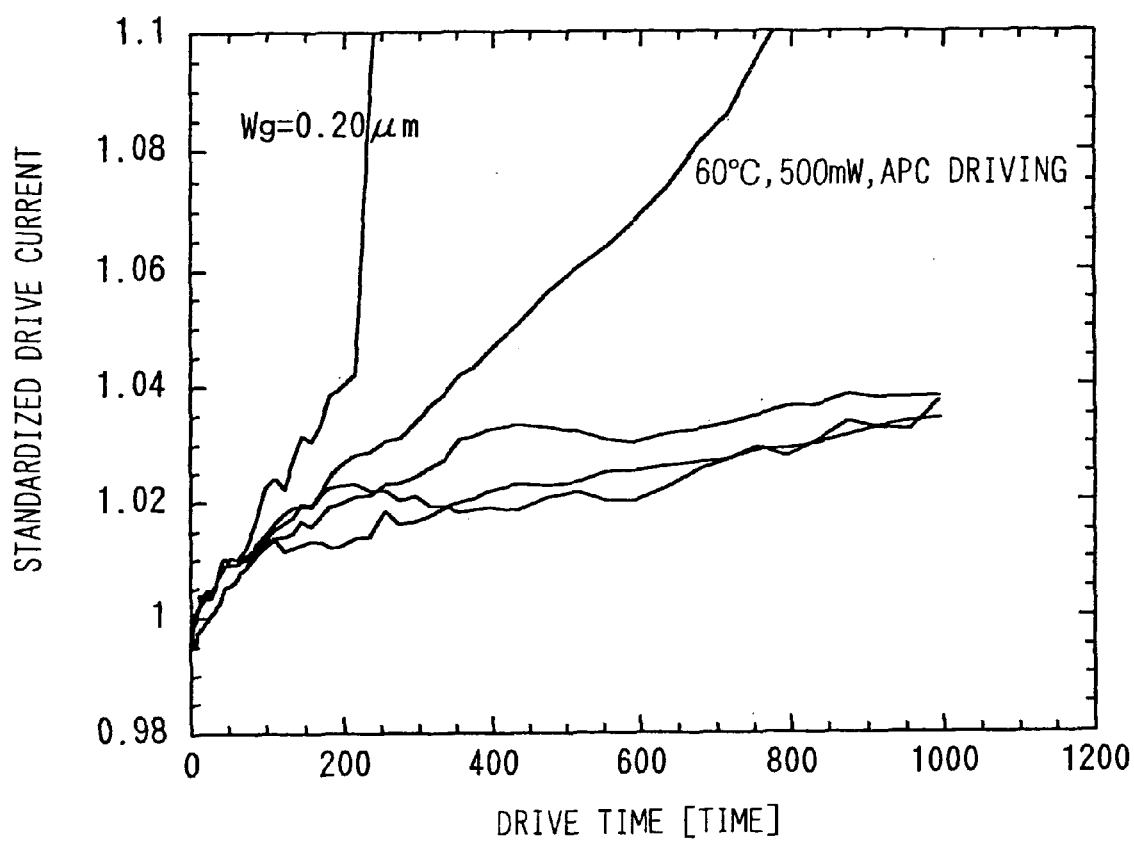
FIG. 8 is a graph showing the results of a reliability test performed when an optical waveguide layer (one side) is of a thickness of 0.20 μm.
Figure 10:
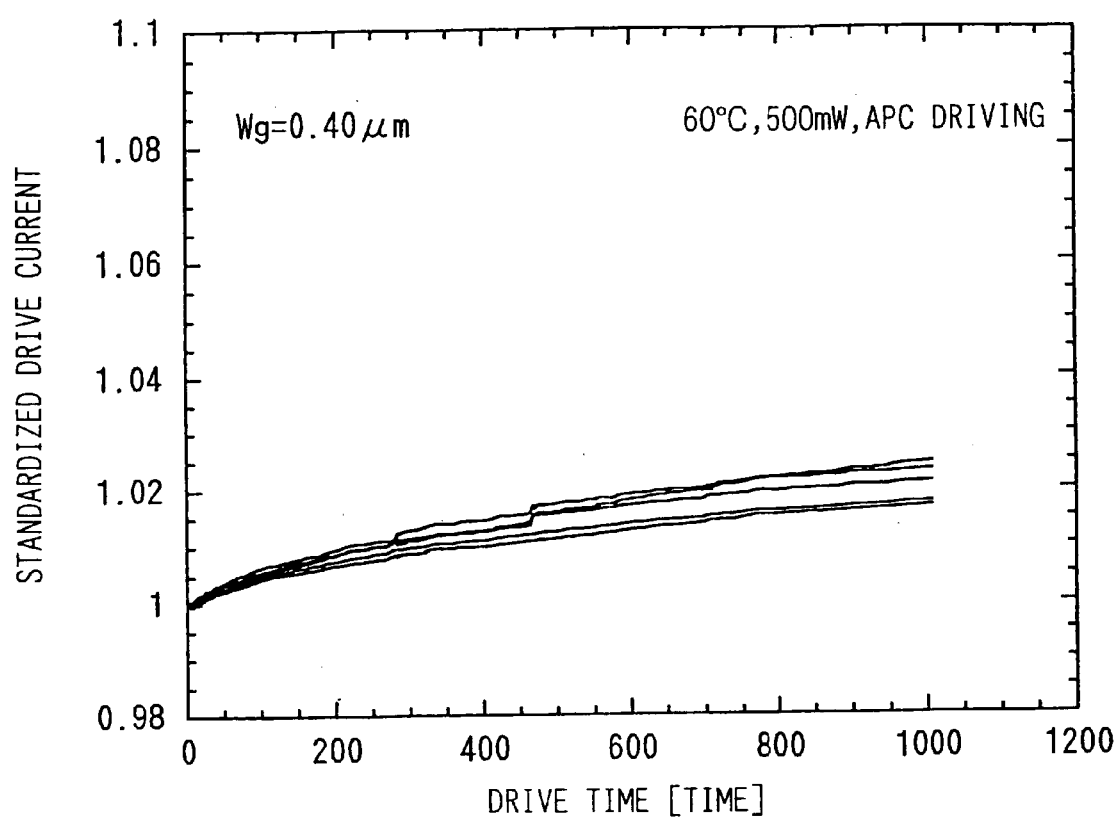
FIG. 10 is a graph showing the results of a reliability test performed when an optical waveguide layer (one side) is of a thickness of 0.40 μm.

Next, reliability tests were performed on the laser according to the fifth embodiment described above, wherein the drive current changes over time during APC driving was measured, with three different thicknesses (Wg) of one side of the optical waveguide layer. The oscillation wavelength was set to be 980 nm, environmental temperature was set to 60° C., and light output was set to 500 mW. Note that the stripe width of the device was 50 μm, and it was made to oscillate in multimode. The graphs showing the results of the reliability tests are shown in FIG. 8, FIG. 9, and FIG. 10. FIG. 8 are the results for a case in which the thickness of the optical waveguide layer (one side) was 0.20 μm, FIG. 9 are the results for a case in which the thickness of the optical waveguide layer (one side) was 0.25 μm, and FIG. 10 are the results for a case in which the thickness of the optical waveguide layer (one side) was 0.40 μm.

As shown in FIG. 8, in the case that the thickness of the optical waveguide layer was 0.20 μm, it was recognized that many devices ceased to oscillate during the test. On the other hand, as shown in FIG. 9 and FIG. 10, if the thickness of the optical waveguide layer was greater than or equal to 0.25 μm, there were no devices that ceased to oscillate during the test. Further, it is evident that the increase rate of the drive current decreases as the thickness of the optical waveguide layer increases.

Figure 11:
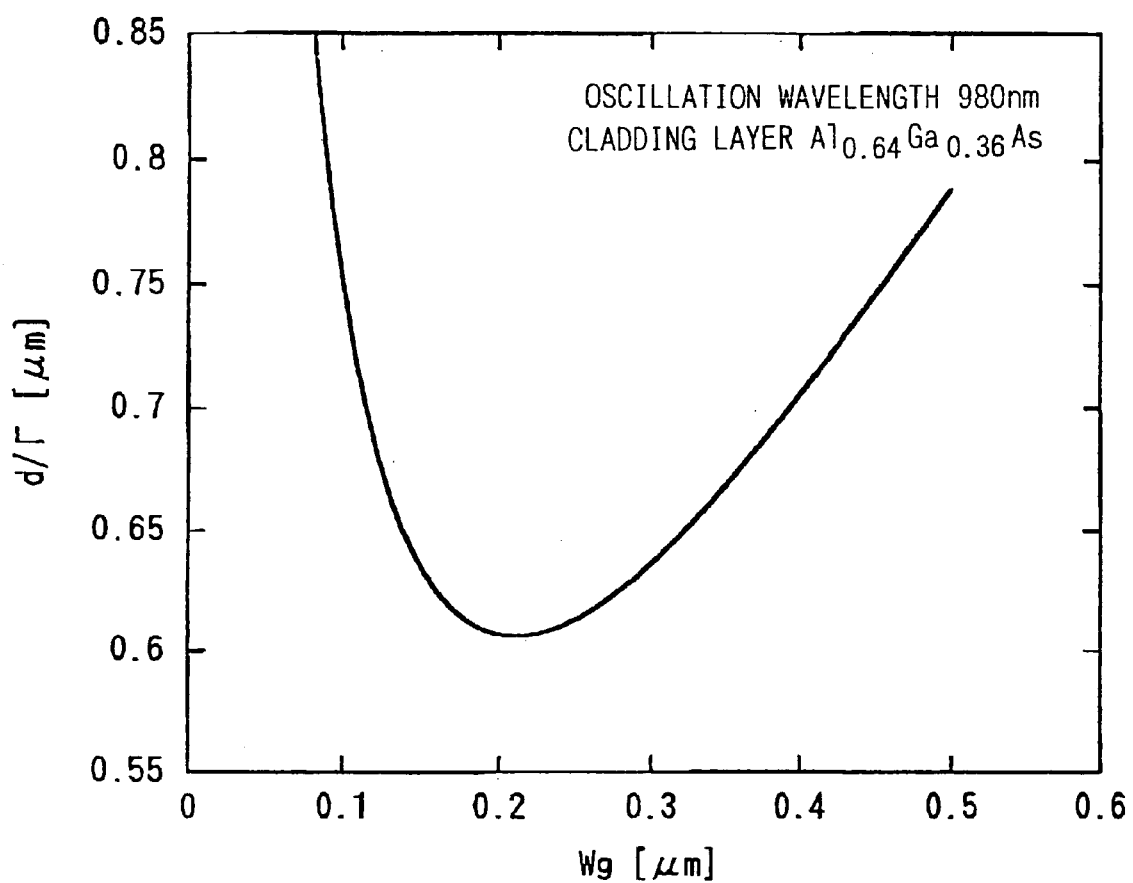
FIG. 11 is a graph showing the relationship between d/Γ and the thickness of the optical waveguide layer (one side).

Next, the influence of the thickness of the optical waveguide layer on the optical power density will be explained. FIG. 11 is a graph that shows the calculated relationship between the thickness of one side of the optical waveguide layer (Wg) and d/Γ (d: the thickness of the active layer, Γ: the coefficient of optical confinement). Note that the composition of the optical waveguide layer was made to be $In_{0.49}Ga_{0.51}P$, the active layer was made to be of an InGaAs type of a thickness of approximately 7 nm that has compression strain in relation to GaAs, and the composition of the cladding layer was made to be $Al_{0.64}Ga_{0.36}As$. Also, the thickness of one side of the tensile strain barrier layer was 10 nm.

As illustrated in FIG. 11, the value of d/Γ is high when Wg≧0.25 μm. That is, it is evident that the optical power density simply decreases. From this, it is evident that the reliability of the semiconductor laser devices of the embodiments described above are dependent on the optical power density, and to maintain satisfactory reliability, it is desirable to make the thickness of the optical waveguide layer greater than or equal to 0.25 μm on one side.

Further, by making the optical waveguide layer thick in this manner, the edging of the evanescent light that leaks into the cladding layer decreases, thereby preventing the ill effects of light absorption by the cap layer. Accordingly, the cladding layer can be made thin. Particularly in the case that AlGaAs, which has a high electrical resistance as well as high heat resistance is used for the cladding layer, it is advantageous to make said cladding layer thin in order to improve the characteristics of the semiconductor laser device. Further, by making the cladding layer thin, it is possible to shorten the crystal growth time, thereby reducing the cost.

What is claimed is:

1. A semiconductor laser device comprising:

a compressive-strain active layer made of $In_{x3}Ga_{1-x3}As_{1-y3}P_{y3}$, where $0<x3\leq0.4$ and $0\leq y3\leq0.1$;

an upper tensile-strain barrier layer, formed on said compressive-strain active layer, made of $In_{x2}Ga_{1-x2}As_{1-y2}P_{1-y2}$, where $0\leq x2<0.49y2$ and $0<y2\leq0.4$;

an upper optical waveguide layer, formed on said upper tensile-strain barrier layer, made of $In_{0.49}Ga_{0.51}P$ that lattice-matches with GaAs;

a lower tensile-strain barrier layer, formed under said compressive-strain active layer, made of $In_{x2}Ga_{1-x2}As_{1-y2}P_{1-y2}$, where $0\leq x2<0.49y2$ and $0<y2\leq0.4$; and a lower optical waveguide layer, formed under said lower tensile-strain barrier layer, made of $In_{0.49}Ga_{0.51}P$ that lattice-matches with GaAs.

2. A semiconductor laser device according to claim 1, wherein an absolute value of a sum of a first product and a second product is equal to or smaller than 0.25 nm, where said first product is a product of a strain and a thickness of said compressive-strain active layer, and said second product is a product of a strain of said lower and upper tensile-strain barrier layers and a total thickness of said lower and upper tensile-strain barrier layers.

3. A semiconductor laser device comprising:

a GaAs substrate of a first conductive type;

a lower cladding layer of said first conductive type, formed on said GaAs substrate;

a lower optical waveguide layer formed on said lower cladding layer and made of $In_{0.49}Ga_{0.51}P$ which is undoped or of said first conductive type;

a lower tensile-strain barrier layer made of $In_{x2}Ga_{1-x2}As_{1-y2}P_{1-y2}$, formed on said lower optical waveguide layer a compressive-strain active layer made of $In_{x3}Ga_{1-x3}As_{1-y3}P_{y3}$ and formed on said lower tensile-strain barrier layer, where $0<x3\leq0.4$ and $0\leq y3\leq0.1$; an upper tensile-strain barrier layer made of $In_{x2}Ga_{1-x2}As_{1-y2}P_{1-y2}$ where $0\leq x2<0.49y2$ and $0<y2\leq0.4$, formed on said compressive-strain active layer;

an upper optical waveguide layer formed on said upper tensile-strain barrier layer and made of $In_{0.49}Ga_{0.51}P$ which is undoped or of a second conductive type;

an etching stop layer made of GaAs of a second conductive type and formed on said upper optical waveguide layer;

a current confinement layer made of $In_{0.49}(Al_{z2}Ga_{1-z2})_{0.51}P$ of said first conductive type, formed on said etching stop layer, where $0.15\leq z2\leq1$;

a cap layer made of $In_{0.49}Ga_{0.51}P$ of said first conductive type or said second conductive type and formed on said current confinement layer;

an upper cladding layer of said second conductive type, formed over said cap layer;

and a contact layer made of GaAs of said second conductive type and formed on said upper cladding layer;

wherein a portion of said semiconductor layer formed by said cap layer, said current confinement layer, as well as said etching stop layer are removed from one resonator facet to said other that faces it from the resonator formed by said layers described above, to a depth at which said optical waveguide layer formed of $In_{0.49}Ga_{0.51}P$ which is undoped or of said second conductive type is exposed;

the groove formed thereby is filled by said cladding layer of said second conductive type formed on said cap layer to form a refractive index waveguide structure; and an absolute value of a sum of a first product and a second product is less than or equal to 0.25 nm, where said first product is a product of a strain and a thickness of said compressive-strain active layer, and said second product is a product of a strain of said lower and upper tensile-strain barrier layers and a total thickness of said lower and upper tensile-strain barrier layers.

4. A semiconductor laser device according to claim 3, wherein said cladding layer of said second conductive type is made of $Al_{z1}Ga_{1-z1}As$ or $In_{0.49}(Al_{z3}Ga_{1-z3})_{0.51}P$, where $0.6\leq z1\leq0.8$ and $0.1\leq z3<z2$.

5. A semiconductor laser device comprising:

a GaAs substrate of a first conductive type;

a lower cladding layer of said first conductive type, formed on said GaAs substrate;

a lower optical waveguide layer made of $In_{0.49}Ga_{0.51}P$ which is undoped or of said first conductive type formed on said lower cladding layer;

a lower tensile-strain barrier layer made of $In_{x2}Ga_{1-x2}As_{1-y2}P_{1-y2}$ wherein ($0\leq x2<0.49y2$ and $0<y2\leq0.4$) formed on said lower optical waveguide layer;

a compressive-strain active layer made of $In_{x3}Ga_{1-x3}As_{1-y3}P_{y3}$ wherein ($0<x3\leq0.4$ and $0\leq y3\leq0.1$) formed on said lower tensile-strain barrier layer;

an upper tensile-strain barrier layer made of $In_{x2}Ga_{1-x2}As_{1-y2}P_{1-y2}$ wherein ($0\leq x2<0.49y2$ and $0<y2\leq0.4$) formed on said compressive-strain active layer;

an upper optical waveguide layer made of $In_{0.49}Ga_{0.51}P$ which is undoped or of a second conductive type formed on said upper tensile-strain barrier layer;

a first upper cladding layer of said second conductive type, formed on said upper optical waveguide layer;

a first etching stop layer made of InGaP of said second conductive type and formed on said first upper cladding layer;

a second etching stop layer made of GaAs of either said first or second conductive type and formed on said first etching stop layer;

a current confinement layer made of $In_{0.49}(Al_{z2}Ga_{1-z2})_{0.51}P$ wherein ($0.15\leq Z2\leq1$) of said first conductive type and formed on said second etching stop layer;

a cap layer made of $In_{0.49}Ga_{0.51}P$ of said first conductive type or said second conductive type and formed on said current confinement layer;

a second upper cladding layer of said second conductive type, formed over said cap layer; and a contact layer made of GaAs of said second conductive type and formed on said second upper cladding layer;

wherein a portion of said semiconductor layer formed by said cap layer, said current confinement layer, as well as said second etching stop layer are removed from one resonator facet to said other that faces it from the resonator formed by said layers described above, to a depth at which said first etching stop layer is exposed;

the groove formed thereby is filled by said second cladding layer of said second conductive type formed on said cap layer to form a refractive index waveguide structure;

and an absolute value of a sum of a first product and a second product is equal to or smaller than 0.25 nm, where said first product is a product of a strain and a thickness of said compressive-strain active layer, and said second product is a product of a strain of said lower and upper tensile-strain barrier layers and a total thickness of said lower and upper tensile-strain barrier layers.

6. A semiconductor laser device according to claim 5, wherein said first upper cladding layer of said second conductive type as well as said second upper cladding layer of said second conductive type are made of $Al_{z1}Ga_{1-z1}As$ or $In_{0.49}(Al_{z3}Ga_{1-z3})_{0.51}P$, where $0.6\leq z1\leq0.8$ and $0.1\leq z3<z2$.

7. A semiconductor laser device according to any one of claims 3 and 5, wherein the width of said groove is 1 to 4 $\mu$m; and the equivalent refractive index step is $1.5\times10^{-3}$ to $7\times10^{-3}$.

8. A semiconductor laser device according to any one of claims 3 and 5, wherein the width of said groove is greater than 4 $\mu$m; and the equivalent refractive index step is greater than or equal to $1.5\times10^{-3}$.

9. A semiconductor laser device comprising:

a GaAs substrate of a first conductive type;

a lower cladding layer of said first conductive type, formed on said GaAs substrate;

a lower optical waveguide layer made of $In_{0.49}Ga_{0.51}P$ which is undoped or of said first conductive type formed on said lower cladding layer;

a lower tensile-strain barrier layer made of $In_{x2}Ga_{1-x2}As_{1-y2}P_{1-y2}$ wherein ($0\leq x2<0.49y2$ and $0<y2\leq0.4$) formed on said lower optical waveguide layer;

a compressive-strain active layer made of $In_{x3}Ga_{1-x3}As_{1-y3}P_{y3}$ wherein ($0<x3\leq0.4$ and $0\leq y3\leq0.1$) formed on said lower tensile-strain barrier layer;

an upper tensile-strain barrier layer made of $In_{x2}Ga_{1-x2}As_{1-y2}P_{1-y2}$ wherein ($0 \leq x2 < 0.49y2$ and $0 < y2 \leq 0.4$) formed on said compressive-strain active layer;

an upper optical waveguide layer made of $In_{0.49}Ga_{0.51}P$ which is undoped or of a second conductive type formed on said upper tensile-strain barrier layer;

an upper cladding layer of said second conductive type formed on said upper optical waveguide layer;

and a contact layer made of GaAs of said second conductive type and formed on said upper cladding layer;

wherein two separate grooves are formed from one resonator facet to said other that faces it from the resonator formed by said layers described above, to a depth at which said optical waveguide layer formed of $In_{0.49}Ga_{0.51}P$ which is undoped or of a second conductive type is exposed;

the ridge formed therebetween forms a refractive index waveguide structure;

and an absolute value of a sum of a first product and a second product is less than or equal to 0.25 nm, where said first product is a product of a strain and a thickness of said compressive-strain active layer, and said second product is a product of a strain of said lower and upper tensile-strain barrier layers and a total thickness of said lower and upper tensile-strain barrier layers.

10. A semiconductor laser device according to claim 9, wherein said cladding layer of said second conductive type is made of either $Al_{z1}Ga_{1-z1}As$ or $In_{0.49}(Al_{z3}Ga_{1-z3})_{0.51}P$, where $0.6 \leq z1 \leq 0.8$ and $0.1 \leq z3 \leq 1$.

11. A semiconductor laser device according to claim 9 wherein an etching stop layer is provided between said optical waveguide layer made of $In_{0.49}Ga_{0.51}P$ which is undoped or of said second conductive type and said cladding layer of said second conductive type; and said etching stop layer is exposed at said bottom of said grooves.

12. A semiconductor laser device according to claim 11, wherein said cladding layer of said second conductive type is composed of $Al_{z1}Ga_{1-z1}As$ ($0.6 \leq z1 \leq 0.8$); and said etching stop layer is composed of $In_{0.49}Ga_{0.51}P$.

13. A semiconductor laser device according to claim 11, wherein said cladding layer of said second conductive type is composed of $In_{0.49}(Ga_{1-z3}Al_{z3})_{0.51}P$ ($0.1 \leq z3 < z2$); and said etching stop layer is composed of GaAs.

14. A semiconductor laser device comprising:

a GaAs substrate of a first conductive type;

a lower cladding layer of said first conductive type, formed on said GaAs substrate;

a lower optical waveguide layer made of $In_{0.49}Ga_{0.51}P$ which is undoped or of said first conductive type formed on said lower cladding layer;

a lower tensile-strain barrier layer made of $In_{x2}Ga_{1-x2}As_{1-y2}P_{1-y2}$ wherein ($0 \leq x2 < 0.49y2$ and $0 < y2 \leq 0.4$) formed on said lower optical waveguide layer;

a compressive-strain active layer made of $In_{x3}Ga_{1-x3}As_{1-y3}P_{y3}$ wherein ($0 < x3 \leq 0.4$ and $0 \leq y3 \leq 0.1$) formed on said lower tensile-strain barrier layer;

an upper tensile-strain barrier layer made of $In_{x2}Ga_{1-x2}As_{1-y2}P_{1-y2}$ wherein ($0 \leq x2 < 0.49y2$ and $0 < y2 \leq 0.4$) formed on said compressive-strain active layer;

an upper optical waveguide layer made of $In_{0.49}Ga_{0.51}P$ which is undoped or a second conductive type formed on said upper tensile-strain barrier layer;

a first upper cladding layer of said second conductive type, formed over said upper optical waveguide layer;

an etching stop layer made of InGaP of said second conductive type and formed on said first upper cladding layer;

a second upper cladding layer of said second conductive type, formed on said etching stop layer; and a contact layer made of GaAs of said second conductive type and formed on said second upper cladding layer;

wherein two separate grooves are formed from one resonator facet to said other that faces it from the resonator formed by said layers described above, to a depth at which said etching stop layer is exposed;

the ridge formed therebetween forms a refractive index waveguide structure; and an absolute value of a sum of a first product and a second product is equal to or smaller than 0.25 nm, where said first product is a product of a strain and a thickness of said compressive-strain active layer, and said second product is a product of a strain of said lower and upper tensile-strain barrier layers and a total thickness of said lower and upper tensile-strain barrier layers.

15. A semiconductor laser device according to claim 14, wherein said first and second cladding layers of said second conductive type be composed of either $Al_{z1}Ga_{1-z1}As$ ($0.6 \leq z1 \leq 0.8$) or $In_{0.49}(Ga_{1-z3}Al_{z3})_{0.51}P$ wherein ($0.1 \leq z3 < z2$).

16. A semiconductor laser device according to claim 14, wherein said first and second cladding layers of said second conductive type are composed of $Al_{z1}Ga_{1-z1}As$ ($0.6 \leq z1 \leq 0.8$); and said etching stop layer is composed of $In_{0.49}Ga_{0.51}P$.

17. A semiconductor laser device according to claim 14, wherein said first and second cladding layers of said second conductive type are composed of $In_{0.49}(Ga_{1-z3}Al_{z3})_{0.51}P$ ($0.1 \leq z3 < z2$); and said etching stop layer is composed of GaAs.

18. A semiconductor laser device according to any of claims 9 and 14, wherein the width of said ridge at the bottom thereof is 1 to 4 $\mu$m; and the equivalent refractive index step is $1.5 \times 10^{-3}$ to $7 \times 10^{-3}$.

19. A semiconductor laser device according to any of claims 9 and 14, wherein the width of said ridge at the bottom thereof is greater than 4 $\mu$m; and the equivalent refractive index step is greater than or equal to $1.5 \times 10^{-3}$.

20. A semiconductor laser device according to any of claims 1, 3, 5, 9, and 14, wherein the thickness of each of said optical waveguide layers is greater than or equal to 0.25 $\mu$m.

21. A semiconductor laser device according to any of claims 1, 3, 5, 9, and 14, wherein a layer of $In_{x4}Ga_{1-x4}As_{1-y4}P_{y4}$ wherein ($x4=0.49y4\pm0.01$ and $0<x4\leq0.3$) that lattice matches with GaAs and has a larger bandgap than said active layer is provided between said compressive-strain active layer of $In_{x3}Ga_{1-x3}As_{1-y3}P_{y3}$ wherein ($0<x3\leq0.4$, $0\leq y3\leq0.1$) and said tensile-strain barrier layer of $In_{x2}Ga_{1-x2}As_{1-y2}P_{y2}$ wherein ($0\leq x2<0.49y2$, $0<y2\leq0.4$).

22. A semiconductor laser device according to any one of claims 1, 3, 5, 9, and 14, wherein a layer of $In_{x4}Ga_{1-x4}As_{1-y4}P_{y4}$ wherein ($x4=0.49y4\pm0.01$, $0<x4\leq0.3$) that lattice matches with GaAs and has a larger bandgap than said active layer is provided between said tensile strain barrier layer of $In_{x2}Ga_{1-x2}As_{1-y2}P_{y2}$ and said optical waveguide layer.

* * * * *